US011854952B2

(12) United States Patent
Sone et al.

(10) Patent No.: US 11,854,952 B2
(45) Date of Patent: Dec. 26, 2023

(54) SEMICONDUCTOR DEVICE AND MEASUREMENT DEVICE

(71) Applicant: LAPIS Semiconductor Co., Ltd., Yokohama (JP)

(72) Inventors: Toshihisa Sone, Yokohama (JP); Kazuya Yamada, Yokohama (JP); Akihiro Takei, Yokohama (JP); Yuichi Yoshida, Miyazaki (JP); Kengo Takemasa, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/708,955

(22) Filed: Mar. 30, 2022

(65) Prior Publication Data

US 2022/0223505 A1    Jul. 14, 2022

Related U.S. Application Data

(60) Continuation of application No. 16/841,293, filed on Apr. 6, 2020, now Pat. No. 11,309,234, which is a
(Continued)

(30) Foreign Application Priority Data

Apr. 27, 2012   (JP) ................................. 2012-104181

(51) Int. Cl.
*H01L 23/29*   (2006.01)
*H01L 23/495*  (2006.01)
(Continued)

(52) U.S. Cl.
CPC .... *H01L 23/49596* (2013.01); *H01L 23/3107* (2013.01); *H01L 23/49503* (2013.01);
(Continued)

(58) Field of Classification Search
CPC ........... H01L 23/49596; H01L 23/3107; H01L 23/49503; H01L 23/49541; H01L 24/49;
(Continued)

(56) References Cited

U.S. PATENT DOCUMENTS 5,703,399 A    12/1997   Majumdar et al.
6,154,095 A    11/2000   Shigemori et al.
(Continued)

FOREIGN PATENT DOCUMENTS

JP    H01135210 A    5/1989
JP    H0353561 A     3/1991
(Continued)

OTHER PUBLICATIONS

Japanese Office Action with translation dated Feb. 16, 2016.

*Primary Examiner* — Kimberly N Rizkallah
*Assistant Examiner* — Dilinh P Nguyen
(74) *Attorney, Agent, or Firm* — Rabin & Berdo, P.C.

(57) ABSTRACT

A semiconductor device includes: an oscillator including external terminals disposed on a first face with a specific distance along a first direction; an integrated circuit including a first region formed with first electrode pads along one side, and a second region formed with second electrode pads on two opposing sides of the first region; a lead frame that includes terminals at a peripheral portion, and on which the oscillator and the integrated circuit are mounted such that the external terminals, the first and second electrode pads face in a substantially same direction and such that one side of the integrated circuit is substantially parallel to the first direction; a first bonding wire that connects one external terminal to one first electrode pad; a second bonding wire that connects one terminal of one lead frame to one second electrode pad; and a sealing member that seals all of the components.

4 Claims, 34 Drawing Sheets

Related U.S. Application Data division of application No. 14/997,658, filed on Jan. 18, 2016, now Pat. No. 10,615,108, which is a continuation of application No. 14/552,510, filed on Nov. 25, 2014, now Pat. No. 9,257,377, which is a continuation of application No. 13/870,436, filed on Apr. 25, 2013, now Pat. No. 8,921,987.

(51) Int. Cl.
| | | |
|---|---|---|
| *H01L 23/31* | (2006.01) | |
| *H01L 23/00* | (2006.01) | |
| *H01L 25/18* | (2023.01) | |
| *H01L 21/56* | (2006.01) | |

(52) U.S. Cl.
CPC ........ *H01L 23/49541* (2013.01); *H01L 24/49* (2013.01); *H01L 25/18* (2013.01); *H01L 21/565* (2013.01); *H01L 24/45* (2013.01); *H01L 24/48* (2013.01); *H01L 2224/05554* (2013.01); *H01L 2224/45144* (2013.01); *H01L 2224/45147* (2013.01); *H01L 2224/48247* (2013.01); *H01L 2224/4917* (2013.01); *H01L 2224/49052* (2013.01); *H01L 2224/49171* (2013.01); *H01L 2924/07811* (2013.01); *H01L 2924/14* (2013.01); *H01L 2924/1461* (2013.01); *H01L 2924/181* (2013.01); *H01L 2924/3025* (2013.01); *H01L 2924/37001* (2013.01); *H01L 2924/3701* (2013.01)

(58) Field of Classification Search
CPC ................... H01L 25/18; H01L 21/565; H01L 2224/45144; H01L 2924/181; H01L 2924/3025
USPC ....................................................... 257/676
See application file for complete search history.

(56) References Cited

U.S. PATENT DOCUMENTS

| | | | |
|---|---|---|---|
| 8,525,306 | B2 | 9/2013 | Tashiro et al. |
| 2004/0070056 | A1 | 4/2004 | Matsuzawa et al. |
| 2004/0178810 | A1* | 9/2004 | Endo ................... G01L 19/083 |
| | | | 324/721 |
| 2005/0052851 | A1* | 3/2005 | Yamada ........... G06K 19/07733 |
| | | | 257/679 |
| 2006/0244131 | A1 | 11/2006 | Kobayashi et al. |
| 2007/0267756 | A1 | 11/2007 | Mao et al. |
| 2012/0018859 | A1 | 1/2012 | Tashiro et al. |
| 2012/0299170 | A1 | 11/2012 | Kehrer et al. |

FOREIGN PATENT DOCUMENTS

| | | |
|---|---|---|
| JP | H0436814 A | 2/1992 |
| JP | H065771 A | 1/1994 |
| JP | H0745778 A | 2/1995 |
| JP | 2002313935 A | 10/2002 |
| JP | 2003249556 A | 9/2003 |
| JP | 2004047811 A | 2/2004 |
| JP | 2004165429 A | 6/2004 |
| JP | 2006080180 A | 3/2006 |
| JP | 2006245618 A | 9/2006 |
| JP | 2007074066 A | 3/2007 |
| JP | 2007201023 A | 8/2007 |
| JP | 2007234994 A | 9/2007 |
| JP | 2008014774 A | 1/2008 |
| JP | 2008219348 A | 9/2008 |
| JP | 2009213061 A | 9/2009 |
| JP | 2010034094 A | 2/2010 |
| JP | 2010123736 A | 6/2010 |
| JP | 2011216916 A | 10/2011 |

* cited by examiner

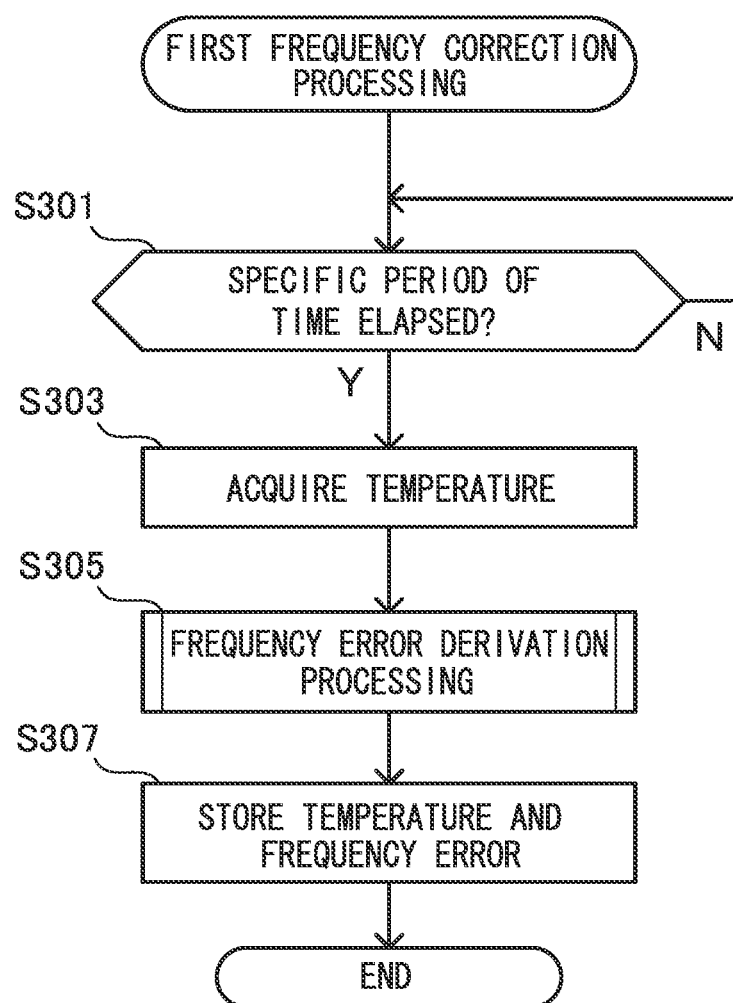

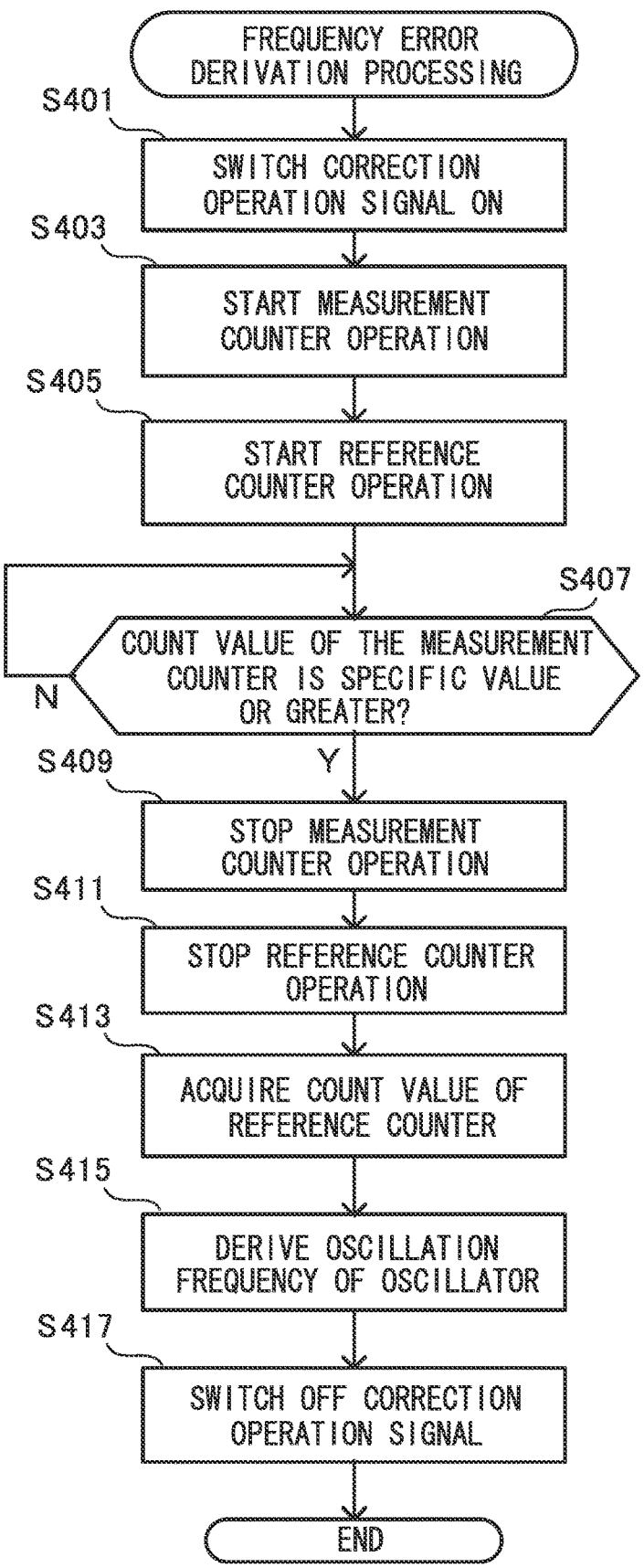

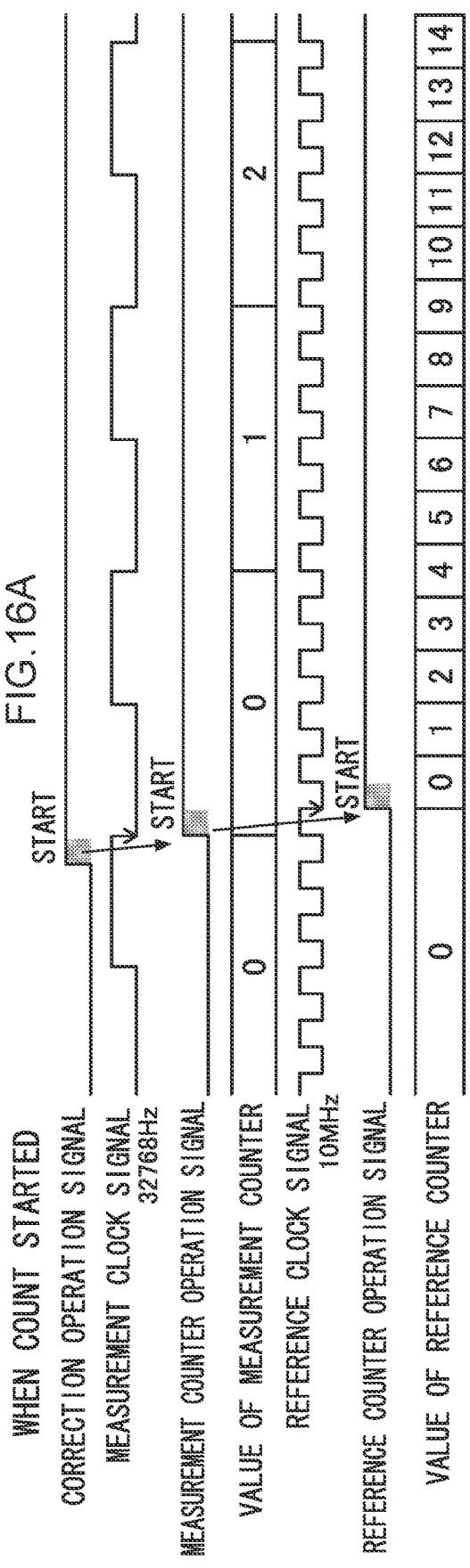
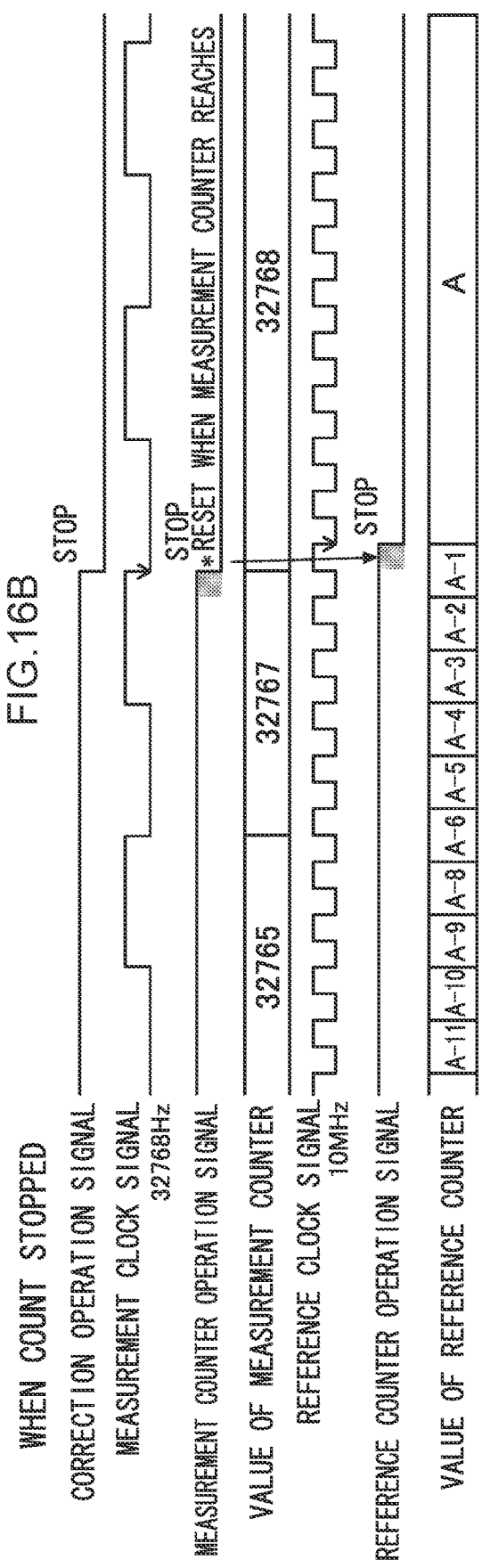

SEMICONDUCTOR DEVICE AND MEASUREMENT DEVICE

CROSS-REFERENCE TO RELATED APPLICATION

This is a Continuation of U.S. application Ser. No. 16/841,293, filed on Apr. 6, 2020, which is a Divisional Application of U.S. application Ser. No. 14/997,658, filed on Jan. 18, 2016 (now U.S. Pat. No. 10,615,108, issued on Apr. 7, 2020), which is a Continuation of application Ser. No. 14/552,510, filed on Nov. 25, 2014 (now U.S. Pat. No. 9,257,377, issued on Feb. 9, 2016), which is a Continuation of U.S. application Ser. No. 13/870,436, filed on Apr. 25, 2013, (now U.S. Pat. No. 8,921,987, issued on Dec. 30, 2014). Furthermore, this application claims priority under 35 USC 119 from Japanese Patent Application No. 2012-104181 filed on Apr. 27, 2012. The disclosures of these prior U.S. and foreign applications are incorporated herein by reference.

BACKGROUND

Technical Field

The present invention relates to a semiconductor device and a measurement device.

Related Art

Recently, in measurement devices such as electricity meters for measuring integral power consumption, there is increasing demand to measure integral power consumption separated by time band. Accompanying this trend, measurement devices configured with a built-in semiconductor device including an oscillator and an integrated circuit, and that are capable of measuring power and time are known. Circuit devices are also known in which an integrated circuit (IC chip) is mounted on an upper face of a lead frame, with the integrated circuit and the lead frame connected by bonding wires, and with an oscillator mounted on an upper face of the integrated circuit through an anisotropic conductive adhesive film (for example, Japanese Patent Application Laid-Open (JP-A) No. 2010-34094).

In cases in which an oscillator is mounted on an upper face of an integrated circuit, it is necessary to match the positions of terminals formed on the integrated circuit and terminals formed on the oscillator, but such configuration is wanting in versatility. Further, since it is necessary to perform the process of connecting the lead frame and the integrated circuit with bonding wires, and the process of connecting the integrated circuit and the oscillator through the anisotropic conductive adhesive film, manufacturing efficiency is poor.

SUMMARY

In consideration of the above circumstances, the present invention provides a semiconductor device and a measurement device that have improved manufacturing efficiency and are also versatile.

A first aspect of the present invention is a semiconductor device including: an oscillator including plural external terminals that are disposed on a first face and that are separated from each other by a specific distance along a first direction; an integrated circuit including a first region formed with plural first electrode pads along one side on a rectangular shaped face, and a second region formed with plural second electrode pads on two opposing sides of the first region; a lead frame that includes terminals at a peripheral portion, and on which the oscillator and the integrated circuit are mounted such that the external terminals, the first electrode pads and the second electrode pads face in a substantially same direction and such that one side of the integrated circuit is substantially parallel to the first direction; a first bonding wire that connects one of the plural external terminals to one of the plural first electrode pads; a second bonding wire that connects one of the terminals of the lead frame terminals to one of the plural second electrode pads; and a sealing member that seals the oscillator, the integrated circuit, the lead frame, the first bonding wires and the second bonding wires.

Due to the above configuration, the present invention is able to provide a semiconductor device and a measurement device that are both versatile and have improved manufacturing efficiency.

BRIEF DESCRIPTION OF THE DRAWINGS

Exemplary embodiments of the present invention will be described in detail based on the following figures, wherein:

FIG. 14 is a flow chart illustrating a flow of first frequency correction processing according to the second exemplary embodiment;

FIG. 15 is a flow chart illustrating a flow of frequency error derivation processing according to the second exemplary embodiment;

FIG. 16A is a timing chart of the frequency error derivation processing according to the second exemplary embodiment and illustrates when counting is started, and FIG. 16B is a timing chart of the same frequency error derivation processing and illustrates when counting is stopped;

DETAILED DESCRIPTION

First Exemplary Embodiment

Detailed explanation follows regarding a semiconductor device according to the present exemplary embodiment, with reference to the appended drawings.

Configuration

Figure 1:
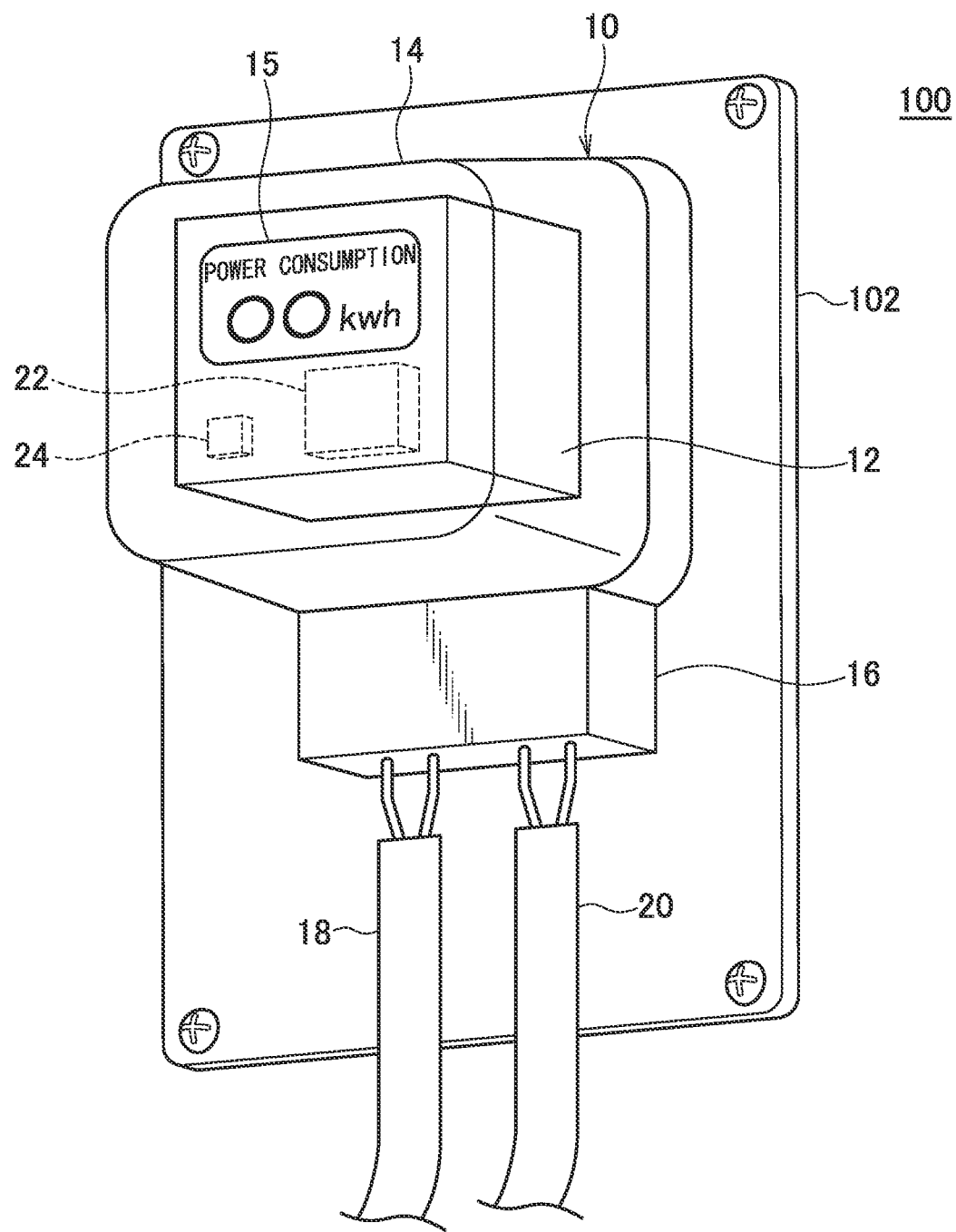
FIG. 1 is a perspective view of an integrating electricity meter provided with a semiconductor device according to a first exemplary embodiment.

As illustrated in FIG. 1, an integrating electricity meter 10 equipped with a semiconductor device according to a first exemplary embodiment is attached to a front face of a fixing plate 102 that is fixed to an external wall 100 of, for example, a house. The integrating electricity meter 10 mainly includes a main body 12, a transparent cover 14 that covers the main body 12, and a connection section 16 provided at a lower portion of the main body 12.

A power supply cable 18 and a load-side cable 20 are connected from below the connection section 16 and supply current to the integrating electricity meter 10. The main body 12 has a rectangular box shape in plan view. A semiconductor device 24 and a power consumption metering circuit 22, both described later, are mounted on a base plate (not illustrated in the drawings) inside the main body 12. The power consumption metering circuit 22 serves as a metering section that measures integral power consumption according to a signal output from the semiconductor device 24. Note that for ease of explanation the sizes of the power consumption metering circuit 22 and the semiconductor device 24 are emphasized in FIG. 1.

A liquid crystal display 15 having a horizontally long shape is provided on the front face of the main body 12. The liquid crystal display 15 displays such information as the power consumption per unit time as measured by the power consumption metering circuit 22 and the integral power consumption used in each time band. Although the integrating electricity meter 10 according to the present exemplary embodiment is an electronic electricity meter in which the power consumption metering circuit 22 is employed as the metering section, there is no limitation thereto. The integrating electricity meter 10 may be an induction type electricity meter, for example, in which a rotating disk is employed for measuring the power consumption.

Figure 2:
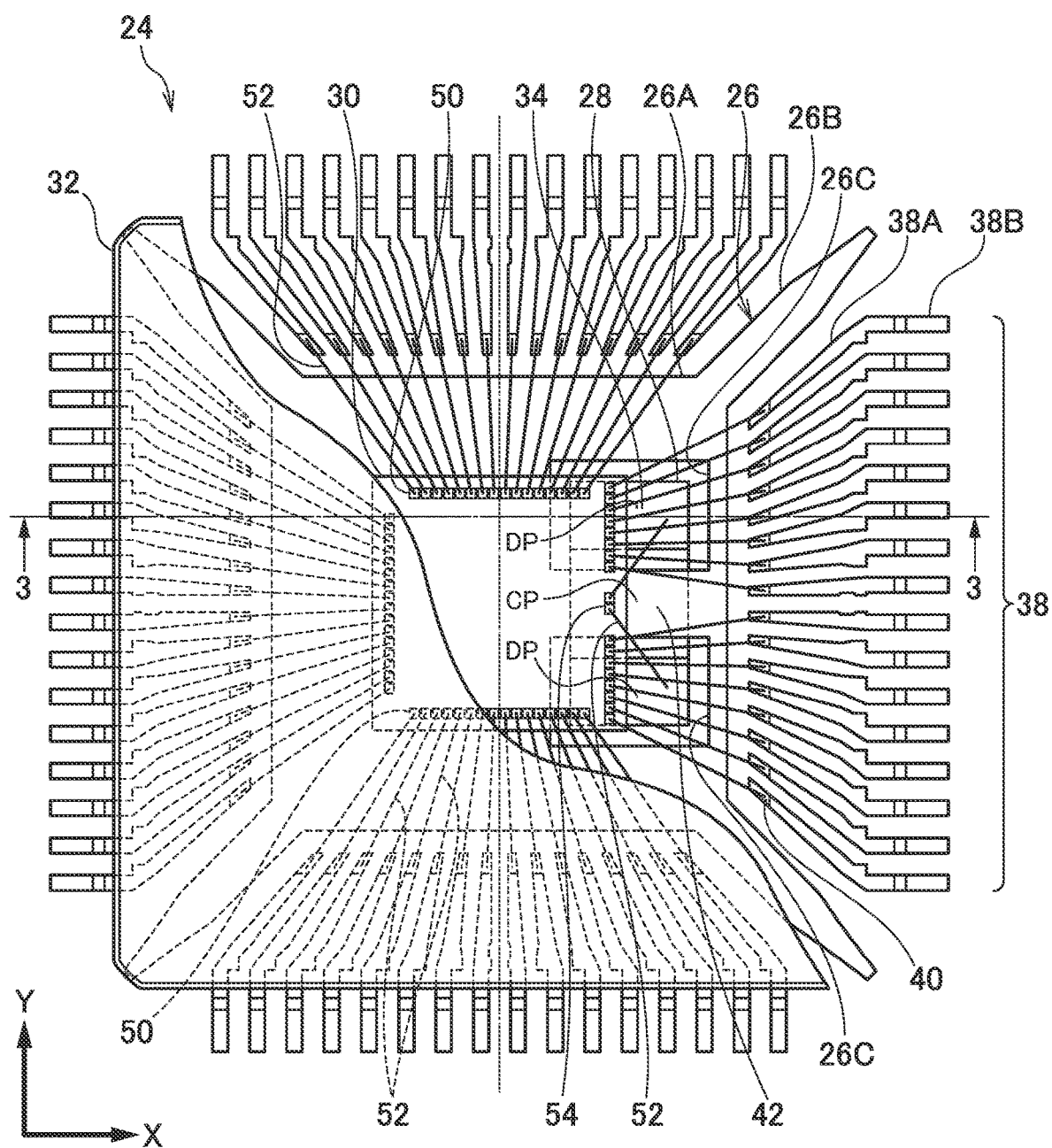
FIG. 2 is a partial cutaway diagram illustrating a semiconductor device according to the first exemplary embodiment, as viewed from the back face.
Figure 3:
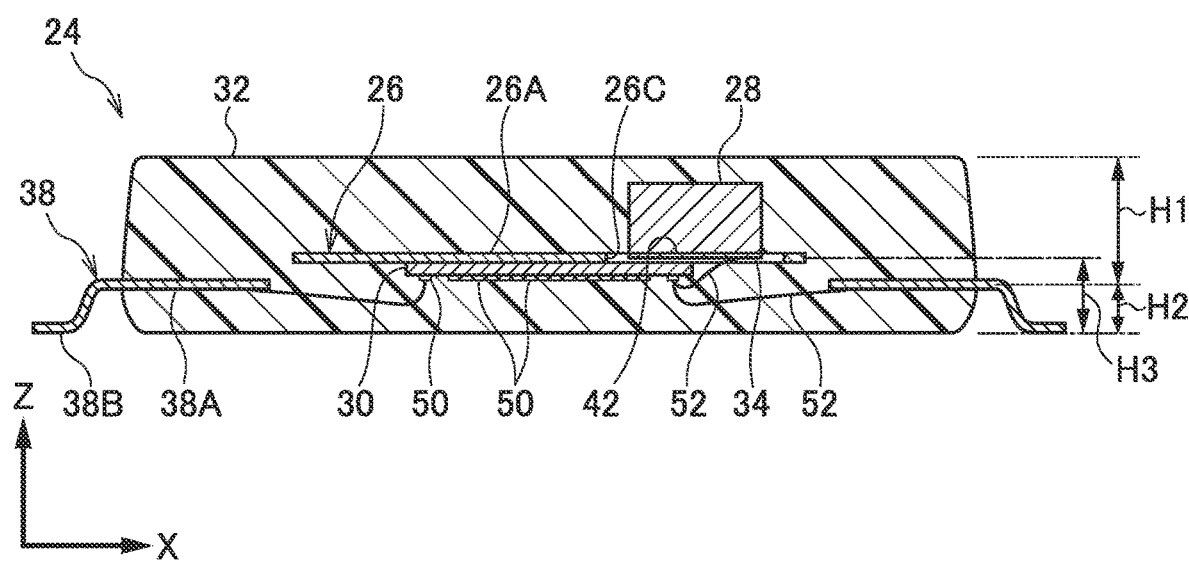
FIG. 3 is a cross-sectional view taken along line 3-3 of FIG. 2.

Detailed explanation follows regarding the semiconductor device 24 according to the present exemplary embodiment. In the following explanation, arrow X indicates the left-right direction of the semiconductor device 24 in the plan view illustrated in FIG. 2, and arrow Y indicates the up-down direction therein, and arrow Z indicates the height direction in the cross-sectional view of the semiconductor device 24 illustrated in FIG. 3. As illustrated in FIG. 2 and FIG. 3, the external shape of the semiconductor device 24 is a rectangular shape in plan view, and the semiconductor device 24 includes a lead frame 26 that serves as a framework, an oscillator 28 mounted to the front face (first face) of the lead frame 26, an LSI 30 that serves as an integrated circuit and is mounted to the back face (second face) of the lead frame 26, and molding resin 32 that serves as a sealing member.

The lead frame 26 is a plate member formed by pressing out a flat sheet of a metal such as copper (Cu) or an iron (Fe) and nickel (Ni) alloy, with a pressing machine. The lead frame 26 includes a die pad 26A provided at a central portion and serving as a mounting section, hanging leads 26B that extend outwards from the die pad 26A along its diagonal lines, and plural leads (terminals) 38 provided between adjacent hanging leads 26B.

The leads 38 are long thin members extending towards the central of the die pad 26A. Plural leads 38 are formed at a specific separation around the periphery of the die pad 26A. In the present exemplary embodiment there are 16 lines of the leads 38 formed between each adjacent pair of the hanging leads 26B. The leads 38 are configured from inner leads 38A positioned at the die pad 26A side of the leads 38, and outer leads 38B positioned at the outer peripheral end side of the semiconductor device 24. The inner leads 38A are pressed down by a press machine so as to be lower than the die pad 26A and extend parallel to the die pad 26A in side view (see FIG. 3). The leading end portions of the inner leads 38A nearest to the die pad 26A are covered with an electroplated film 40. Although the electroplated film 40 in the present exemplary embodiment is formed from silver (Ag), for example, there is no limitation thereto, and the electroplated film may be formed from other metal such as gold (Au).

The outer leads 38B are exposed from the molding resin 32, bent further downwards, and their leading end portions are parallel to the inner leads 38A in side view. Namely, the outer leads 38B are configured as gull-wing leads. The outer leads 38B are covered by an electroplated solder film. Substances which may be employed as an electroplated solder film include, for example, tin (Sn), a tin (Sn) and lead (Pb) alloy, or a tin (Sn) and copper (Cu) alloy.

The die pad 26A at the central portion of the lead frame 26 is a flat plate member having a rectangular shape in plan view. Two openings 26C are formed at the right side of the central portion of the die pad 26A, penetrating through along the die pad 26A thickness direction. The openings 26C are each formed in a rectangular shape having their long sides along the transverse (left-right)direction, and face external electrodes 34 of the oscillator 28, which are described later (see FIG. 4).

The region between the two openings 26C configures an oscillator mounting beam 42, which serves as an oscillator mounting region extending in the left-right direction of FIG. 2. The oscillator 28 is mounted to the front face of the oscillator mounting beam 42 of the lead frame 26 (see FIG. 4), via a bonding agent (not illustrated in the drawings). In other words, the openings 26C are provided at each opposite side of the oscillator mounting beam 42. The oscillator 28 is an electrical component having a rectangular shape with its longitudinal direction oriented in the up-down direction of FIG. 2. In the present exemplary embodiment, a generic oscillator with a frequency of 32.768 kHz, mountable to general electronic devices, and which is externally attachable to the semiconductor device 24, is employed as the oscillator 28.

Figure 4:
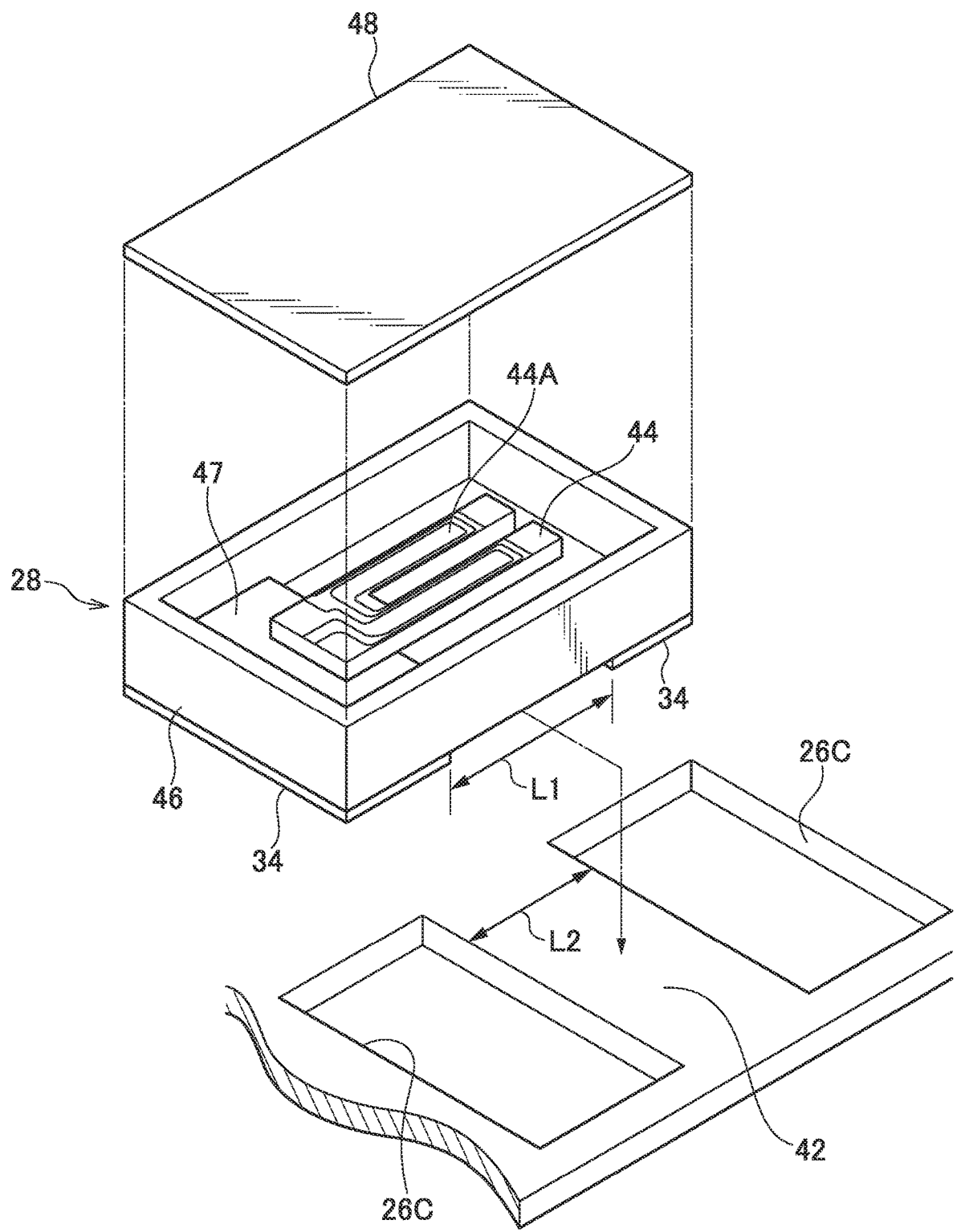
FIG. 4 is an exploded perspective view illustrating an oscillator according to the first exemplary embodiment.

As illustrated in FIG. 4, the oscillator 28 has a rectangular shape in plan view and includes a vibrating reed 44, a package body 46 that houses the vibrating reed 44, and a lid 48. The vibrating reed 44 is a quartz crystal vibrating reed, in which excitation electrodes 44A are formed as a film on the surface of a quartz crystal having a tuning fork shape and formed from an artificial quartz crystal. The vibrating reed 44 vibrates due to a piezoelectric effect when current flows in the excitation electrodes 44A. The vibrating reed 44 is not limited to a tuning fork shape and an AT cut quartz crystal may be employed. Further, vibrating reeds formed from lithium tantalate ($LiTaO_3$) or lithium niobate ($LiNbO_3$) may also be employed. An MEMS vibrating reed formed from silicon may also be employed.

The package body 46 is formed as a box shape opened at its upper portion. A seat 47 on which the vibrating reed 44 is affixed is formed at one longitudinal direction end side of a bottom portion of the package body 46. The base portion of the vibrating reed 44 is fixed to the seat 47 to allow vibration, and the vibrating reed 44 is hermetically sealed by joining together the package body 46 and the lid 48 in a vacuum state. The external electrodes 34 are formed at two ends of the lower face of the package body 46, and are separated from each other by a specific distance L1. The external electrodes 34 serve as terminals that are electrically connected to the excitation electrodes 44A of the vibrating reed 44. A width L2 of the oscillator mounting beam 42 is formed narrower than the distance between the external electrodes 34.

The lengths of the external electrodes 34 along the width direction of the package body 46 match with the width of the package body 46. As illustrated in FIG. 2, the size of the external electrodes 34 is larger than the size of electrode pads 50 and oscillator electrode pads 54 formed on the LSI 30, which are described later. The openings 26C of the die pad 26A are also formed larger than the external electrodes 34.

As illustrated in FIG. 2 and FIG. 3, the LSI 30 serving as an integrated circuit or a semiconductor chip is mounted on the back face of the lead frame 26 at the central portion of the die pad 26A using a bonding member (not illustrated in the drawings). The LSI 30 is a thin rectangular shaped electronic component, and an end portion on the right side of the LSI 30 covers about half of each of the openings 26C. The oscillator 28 and the LSI 30 are accordingly disposed so as to overlap in a plan view projection. The external electrodes 34 of the oscillator 28 are exposed through the openings 26C when the lead frame 26 is viewed from the LSI 30 side.

The plural electrode pads 50 that are electrically connected to the wiring lines inside the LSI 30 are provided at an outer peripheral end portion around each side of the lower face of the rectangular shaped LSI 30. The electrode pads 50 are formed from a metal, such as aluminum (Al) or copper (Cu), and 16 electrode pads 50 are provided on each side of the LSI 30. The number of the electrode pads 50 may be the same on each of the sides, or may be a different such that there are fewer or more electrode pads 50 provided on the side on which the oscillator electrode pads 54 (described later) are provided. The electrode pads 50 are connected by bonding wires 52 to the inner leads 38A. Although the number of the electrode pads 50 provided in the present exemplary embodiment is 16 on each of the sides of the LSI 30 so as to match the number of the leads 38, there is no limitation thereto, and the electrode pads 50 may be provided more than the number of the leads 38 for used in another application.

The oscillator electrode pads 54 are also provided, separately to the electrode pads 50, at an outer peripheral portion at the oscillator 28 side of the LSI 30. Two oscillator electrode pads 54 are provided between the electrode pads 50, at the central portion along the up-down direction of the LSI 30 in FIG. 2. Namely, a layout region (first region) for the oscillator electrode pads 54 is formed at the central portion of one peripheral side of the LSI, and layout regions (second regions) for the electrode pads 50 are formed at other regions on the one peripheral side, where the oscillator electrode pads 54 are provided, from the central portion to the both ends of this side, and are formed on the remaining three peripheral sides. The oscillator electrode pads 54 are connected to the external electrodes 34 of the oscillator 28 by the bonding wires 52 that pass through the openings 26C. The bonding wires 52 are wire shaped conducting members formed from a metal such as gold (Au) or copper (Cu).

The two oscillator electrode pads 54 that are provided at the central portion along the up-down direction of the LSI 30 in FIG. 2, are separated from the electrode pads 50 that are provided on the same side. In other words, the interval between the oscillator electrode pads 54 and the adjacent electrode pads 50 is greater than the interval between the electrode pads 50.

In another embodiment, the interval between the wire bonded electrode pads 50 and the oscillator electrode pads 54 may be made greater than the interval between the wire bonded electrode pads 50 by making the interval between the oscillator electrode pads 54 and the adjacent electrode pads 50 the same as that between the electrode pads 50, and not wire bonding the electrode pads 50 disposed adjacent to the oscillator electrode pads 54. In other words, for the electrode pads 50 of the LSI 30, the interval between the bonding wire 52 connecting the oscillator electrode pads 54 and the external electrodes 34 and the bonding wire 52 connecting together the electrode pads 50 and the inner leads 38A is greater than the distance between the bonding wires 52 connecting the electrode pads 50 and the inner leads 38A.

The bonding wires 52 that connect the oscillator electrode pads 54 and the external electrodes 34, and the bonding wires 52 that connect the electrode pads 50 and the inner leads 38A, are formed in a three-dimensional (3-D) intersection form. As illustrated in FIG. 3, the bonding wires 52 that connect the electrode pads 50 and the inner leads 38A stride over the bonding wires 52 that connect the oscillator electrode pads 54 and the external electrodes 34. Namely, in order to prevent shorting of the bonding wires 52, the apex of the bonding wires 52 that connect the oscillator electrode pads 54 and the external electrodes 34 is formed to be lower (less far away from the lead frame 26) than the apex of the bonding wires 52 that connect the electrode pads 50 and the inner leads 38A.

Given that the lead frame 26 is taken as a reference plane, the height of the apex of the bonding wires 52 that connect the oscillator electrode pads 54 and the external electrodes 34 may be made smaller than the height of the apex of all of the bonding wires 52 that together the electrode pads 50 and the inner leads 38A, or may be made smaller only than the height of the apex of the bonding wires 52 that connect the electrode pads 50 and the inner leads 38A and are disposed between the oscillator electrode pads 54 and the external electrodes 34.

The center of the LSI 30 and the center CP of the rectangular shaped oscillator 28 are aligned substantially along the X-axis direction. Namely, the width of any displacement of the center CP of the oscillator 28 from the X-axis in the Y-axis direction is narrower than the Y-axis direction width of the central portion along the up-down direction of the LSI 30 where the oscillator electrode pads 54 are disposed. In this layout, the oscillator electrode pads 54 provided at the center portion of a given peripheral side of the LSI 30 and the external electrodes 34 that are separately disposed at the two ends along the longitudinal direction of the oscillator 28 are connected by the bonding wires 52. Further, the electrode pads 50 arranged in both sides of the oscillator electrode pads 54 and the inner leads 38A arranged parallel to the electrode pads 50 along the Y-axis direction are also connected by the bonding wires 52.

Since the oscillator electrode pads 54 are separately disposed from the electrode pads 50, the bonding wires 52 that connect the electrode pads 50 and the inner leads 38A pass through portions below the bonding wires 52 connect the oscillator electrode pads 54 and the external electrodes 34. Namely, it is possible to avoid the bonding wires 52 that connect the electrode pads 50 and the inner leads 38A crossing at the vicinity of the apex of the bonding wires 52 that connect the oscillator electrode pads 54 and the external electrodes 34, whereby an efficient three-dimensional intersection can be formed. Further, the height of the apex of the bonding wires 52 that connect the electrode pads 50 and the inner leads 38A can be reduced, whereby the height of the package can also be made small.

The connection positions of the bonding wires 52 to the external electrodes 34 of the oscillator 28 is displaced from the center of the oscillator 28 in the X-axis direction toward the inner leads 38A side. Such connection configuration enables avoiding contact of the bonding wires 52 with the end portions of the LSI 30. The connection positions of the bonding wires 52 to the external electrodes 34 of the oscillator 28 are also displaced from the center of the external electrodes 34 in the X-axis direction towards the center of the oscillator 28. Such connection configuration enables the number of cross-overs of the bonding wires 52 connected to the external electrodes 34 with the bonding wires 52 that connect the electrode pads 50 and the inner leads 38A can be reduced.

The oscillator 28, the LSI 30 and the lead frame 26 are sealed with the molding resin 32, which forms the external profile of the semiconductor device 24. The molding resin 32 is poured without generating internal voids, and the height of the molding resin 32 is twice the height of the inner leads 38A or greater. In other words, a distance H1 from the surface of the molding resin 32 at the oscillator 28 mounting side to the center in Z-axis of the inner leads 38A is greater than a distance H2 from the surface of the molding resin 32 at the LSI 30 mounting side to the center in Z-axis of the inner leads 38A. A distance H3 from the surface of the molding resin 32 at the LSI 30 mounting side to the center in Z-axis of the lead frame 26 is also greater than the distance H2 from the surface of the molding resin 32 at the LSI 30 mounting side to the center in Z-axis of the inner leads 38A. The present exemplary embodiment employs a thermoset epoxy resin containing silica based filler as the molding resin 32. However, embodiments are not limited thereto, and, for example, a thermoplastic resin may be employed therefor.

Figure 5:
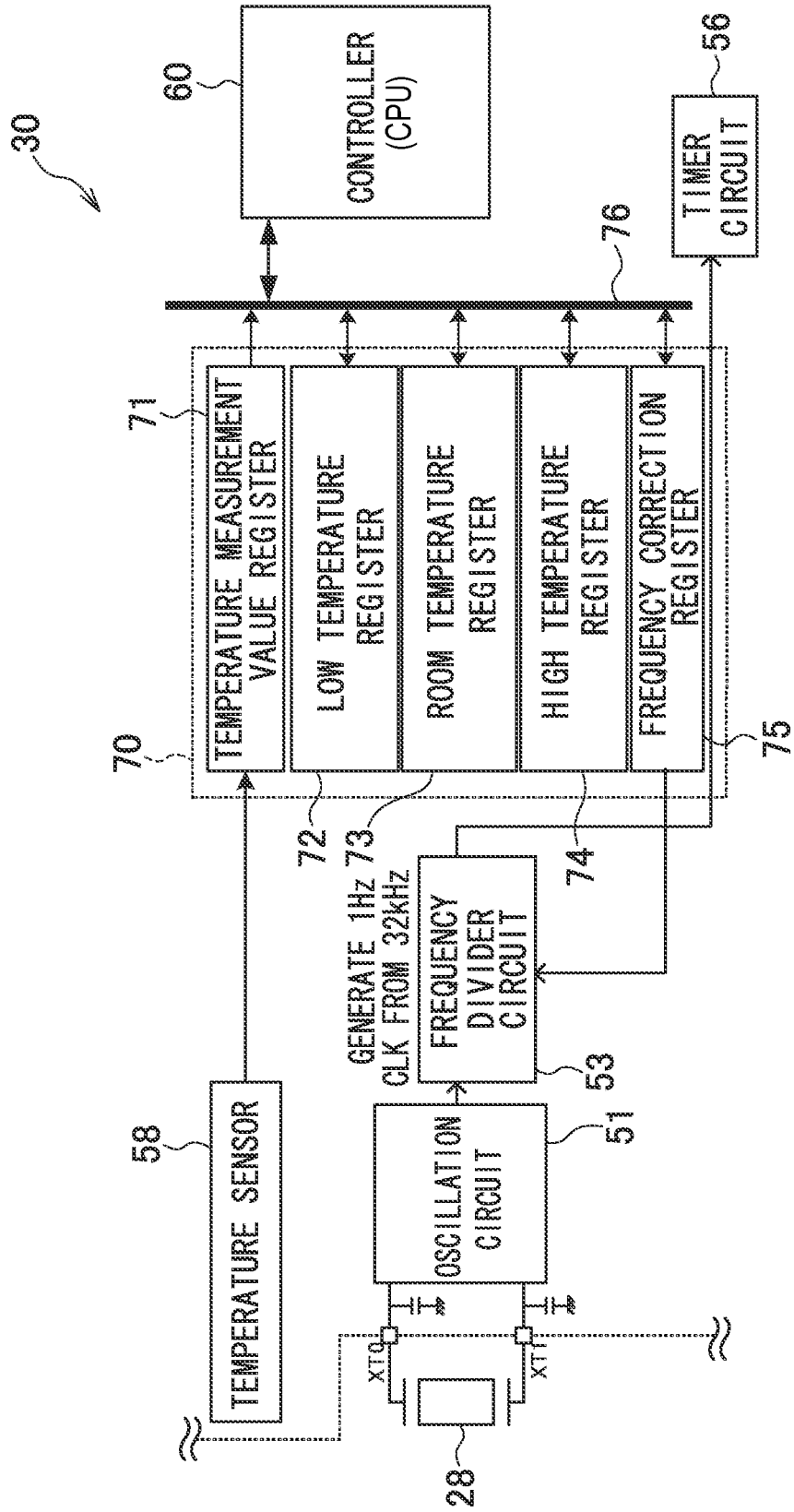
FIG. 5 is a block diagram for explaining an LSI of a semiconductor device according to the first exemplary embodiment.

Explanation follows regarding an internal configuration of the LSI 30. As illustrated in FIG. 5, the LSI 30 is built-in with an oscillation circuit 51, a frequency divider circuit 53, a timer circuit 56, a temperature sensor 58, a controller (CPU) 60, and a registry section 70. The oscillation circuit 51 is connected to the oscillator 28 and causes the oscillator 28 to oscillate. The frequency divider circuit 53 frequency-divides a signal (in the present exemplary embodiment, at a frequency of 32.768 kHz) output from the oscillator 28 to give a specific clock (for example 1 Hz). The timer circuit 56 measures time based on the signal that has frequency-divided by the frequency divider circuit 53 and transmits the time to the controller 60. The temperature sensor 58 measures the temperature of the LSI 30 and transmits the measured temperature to the controller 60. It is possible to assume that the temperature of the oscillator 28 that is disposed in the same lead frame as of the LSI 30, and in the vicinity of the LSI 30, and that is electrically connected to the LSI 30, is the same as the temperature of the LSI 30. Namely, the temperature sensor 58 is capable of measuring the temperature of the oscillator 28 disposed at the periphery of the LSI 30 with good precision. The controller 60 displays on the liquid crystal display 15 (see FIG. 1) information such as the power consumption per unit time that is measured by the power consumption metering circuit 22 based on the time measured by the timer circuit 56. The registry section 70 includes plural registers for storing various data used for correcting the oscillation frequency of the oscillator 28. Detailed explanation regarding the plural registers is given later in a description of oscillation frequency correction. The LSI 30 also has a built-in computation circuit that performs computation and a built-in internal power source.

Manufacturing Procedure

Explanation follows regarding a manufacturing procedure of the semiconductor device 24.

Figure 6A:
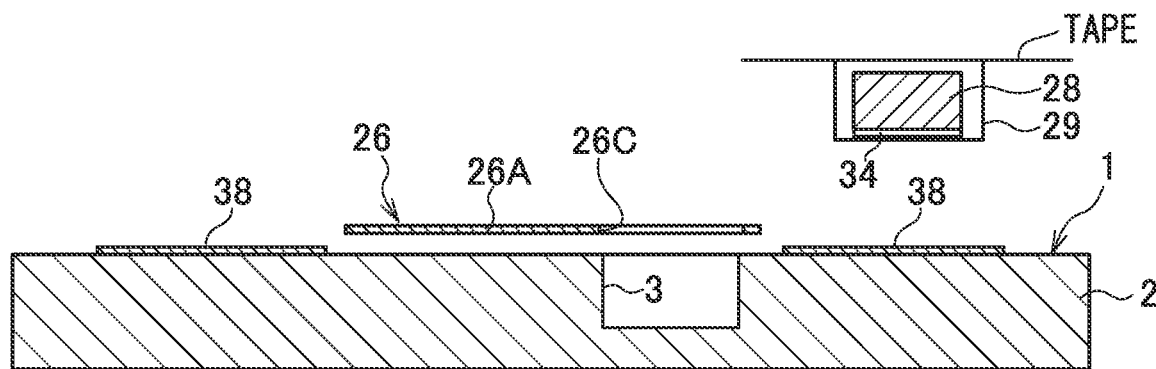
FIG. 6A to FIG. 6E are explanatory diagrams illustrating a wire bonding procedure for disposing an oscillator and an LSI on a lead frame in a manufacturing method of the semiconductor device according to the first exemplary embodiment.

First, as illustrated in FIG. 6A, the lead frame 26 is placed on a mounting block 2 of a bonding apparatus 1 such that the leads 38 are positioned downwards. A well cavity 3 is formed in the mounting block 2 in order to house the oscillator 28 when the lead frame 26 is inverted after the oscillator 28 is fixed to the first face. The oscillator 28 is conveyed in sealed in a package 29 on a tape with the external electrodes 34 facing downwards. The openings 26C is formed in advance in the lead frame 26 by a process such as pressing.

Figure 6B:
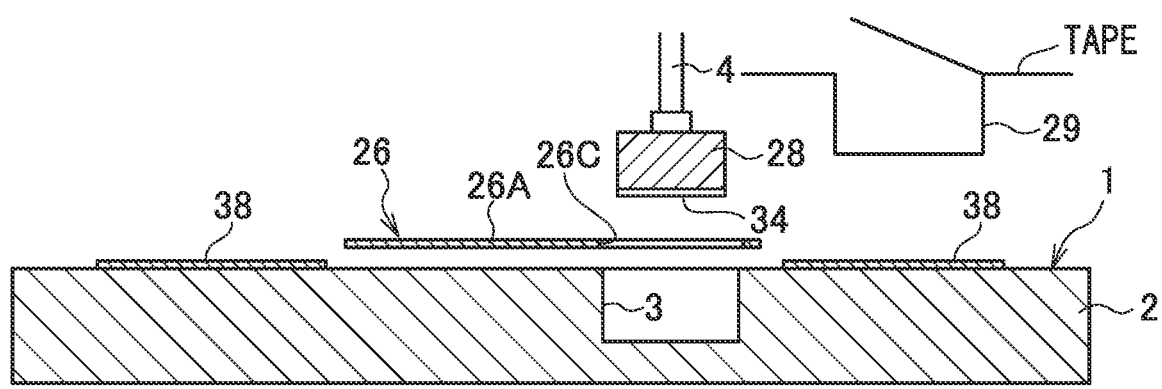

Next, as illustrated in FIG. 6B, the package 29 is unsealed, and the oscillator 28 is taken out with a picker 4, and the oscillator 28 is disposed on the first face of the die pad 26A, namely on the top face in FIG. 6B, such that the external electrodes 34 of the oscillator 28 overlap with the openings 26C. Then, the oscillator 28 is fixed to the die pad 26A with bonding agent. In cases in which the oscillator 28 is sealed in the package 29 in a state in which the external electrodes 34 face upwards, it is preferable to employ a picker 4 with a rotation mechanism, so that the oscillator 28 can be vertically inverted using the rotation mechanism after the oscillator 28 has been taken out by the picker 4, and can be mounted on the first face of the die pad 26A after directing the external electrodes 34 downwards.

Figure 6C:
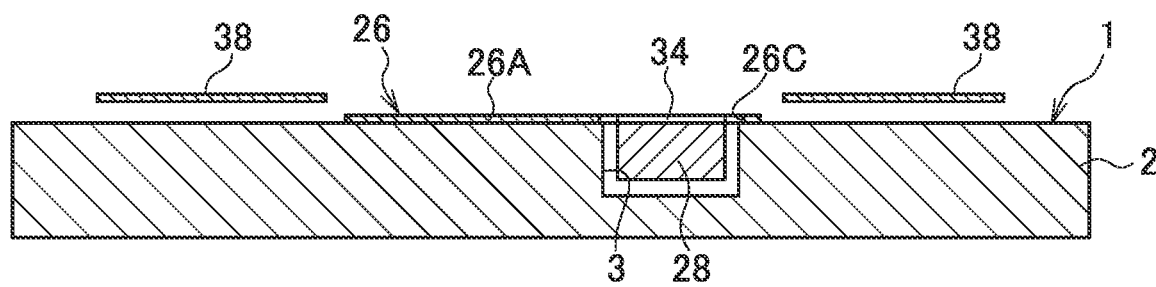

After fixing the oscillator 28 to the first face of the die pad 26A, the lead frame 26 is vertically inverted and placed on the mounting block 2, as illustrated in FIG. 6C. The lead frame 26 is thereby placed on the mounting block 2 in a state in which the first face is facing downwards. At this time, the oscillator 28 is housed in the well cavity 3.

Figure 6D:
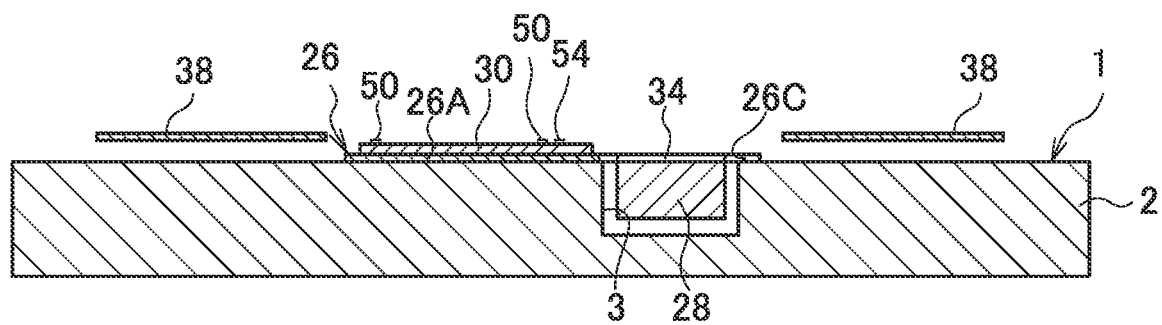

After vertically inverting the lead frame 26 and placing the lead frame 26 on the mounting block 2, the LSI 30 is fixed on the second face of the die pad 26A, which is the opposite side to the first face of the die pad 26A, at a portion that is adjacent to the openings 26C, as illustrated in FIG. 6D. The second face is illustrated as the upper face of the die pad 26A in FIG. 6D.

Figure 6E:
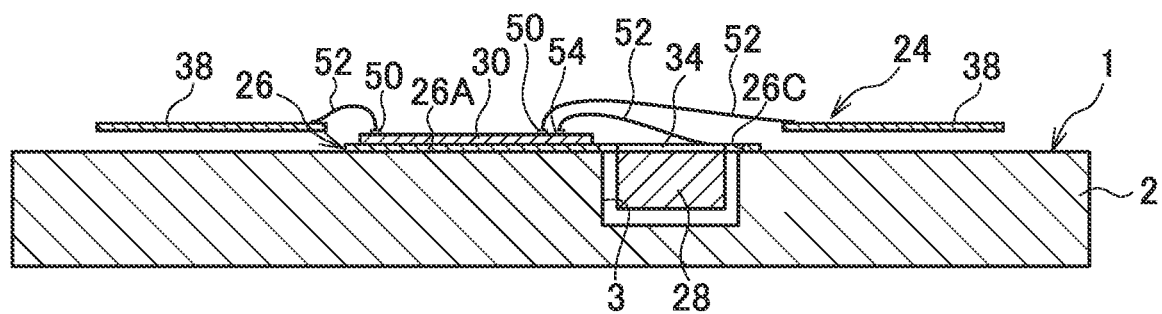

Finally, as illustrated in FIG. 6E, the electrode pads 50 of the LSI 30 and the leads 38 are connected with the bonding wires 52, and the oscillator electrode pads 54 of the LSI 30 and the external electrodes 34 of the oscillator 28 are connected with the bonding wires 52, thereby forming the semiconductor device 24. At this time, the height of the apex of each of the bonding wires 52 that connect the oscillator electrode pads 54 of the LSI 30 and the external electrodes 34 of the oscillator 28 is made lower than the height of the apex of each of the bonding wires 52 that connect the electrode pads 50 of the LSI 30 and the leads 38. After the oscillator electrode pads 54 of the LSI 30 and the external electrodes 34 of the oscillator 28 have been connected with the bonding wires 52, the electrode pads 50 of the LSI 30 and the leads 38 are connected with the bonding wires 52 so as to span over the previously connected bonding wires 52. Further, the bonding wires 52 that connect the oscillator electrode pads 54 of the LSI 30 and the external electrodes 34 of the oscillator 28 and the bonding wires 52 that connect the electrode pads 50 and the leads 38 are configured to form a 3-D intersection. Specifically, the configuration is made such that the bonding wires 52 that connect the electrode pads 50 of the LSI 30 and the leads 38 cross over the bonding wires 52 that connect the oscillator electrode pads 54 of the LSI 30 and the external electrodes 34 of the oscillator 28 at positions displaced from the apexes of the bonding wires 52 that connect the oscillator electrode pads 54 and the external electrodes 34.

According to the procedure illustrated in FIG. 6A to FIG. 6E, by fixing the oscillator 28 and the LSI 30 to the lead frame 26 (the die pad 26A) and connecting the LSI 30 and the oscillator 28, the connection of the LSI 30 and the oscillator 28 can be efficiently performed from the second face side of the die pad 26A as well as the connection of the LSI 30 and the leads 38, even though the LSI 30 is fixed to the second face of the die pad 26A, which is the opposite side to the first face of the die pad 26A on which the oscillator 28 is affixed. Further, since the oscillator 28 and the LSI 30 are directly connected with the bonding wires 52 rather than being connected through the lead frame 26, the wiring resistance can be reduced compared to cases in which the oscillator 28 and the LSI 30 are connected through the lead frame 26, or cases in which bonding wires 52 are pulled around to the back side of the lead frame 26 for connection.

Explanation next follows regarding a procedure for sealing the semiconductor device 24 with the molding resin 32.

Figure 7A:
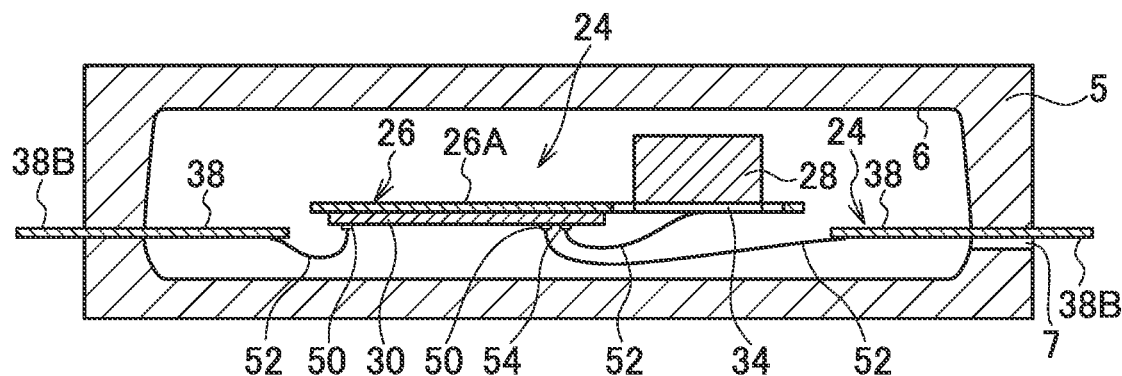
FIG. 7A to 7D are explanatory diagrams illustrating a procedure for resin sealing the lead frame, the oscillator and the LSI in the manufacturing method of the semiconductor device according to the first exemplary embodiment.

First, as illustrated in FIG. 7A, the semiconductor device 24 is fixed inside a cavity 6 of a mold 5 such that the first face of the lead frame 26 (the die pad 26A), which is the face on which the oscillator 28 is affixed, is directed upward, and the second face of the lead frame 26 (the die pad 26A), which is the face on which the LSI 30 is affixed, is directed downward. Since the thickness of the oscillator 28 is greater than the LSI 30, the semiconductor device 24 is disposed inside the cavity 6 such that the lead frame 26 (the die pad 26A) is positioned lower than the height direction center of the cavity 6 in the mold 5. The outer leads 38B protrude out to the outside of the mold 5 in a state in which the semiconductor device 24 is fixed inside the cavity 6.

Figure 7B:
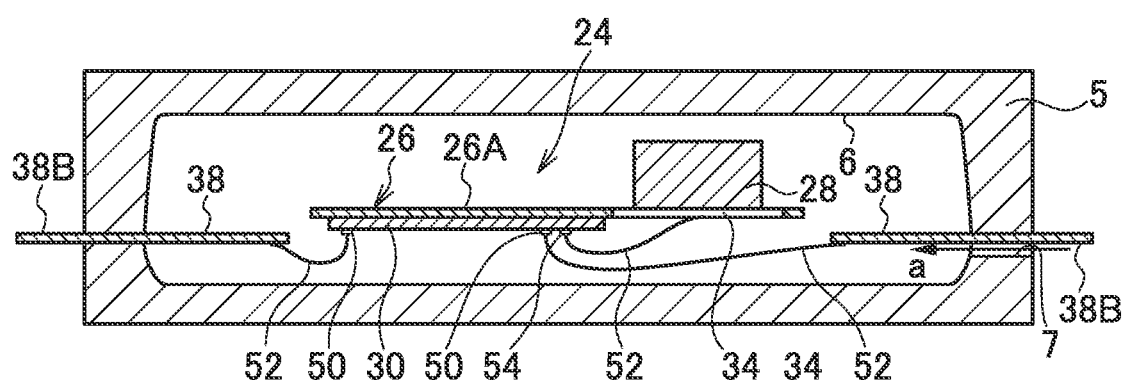
Figure 7C:
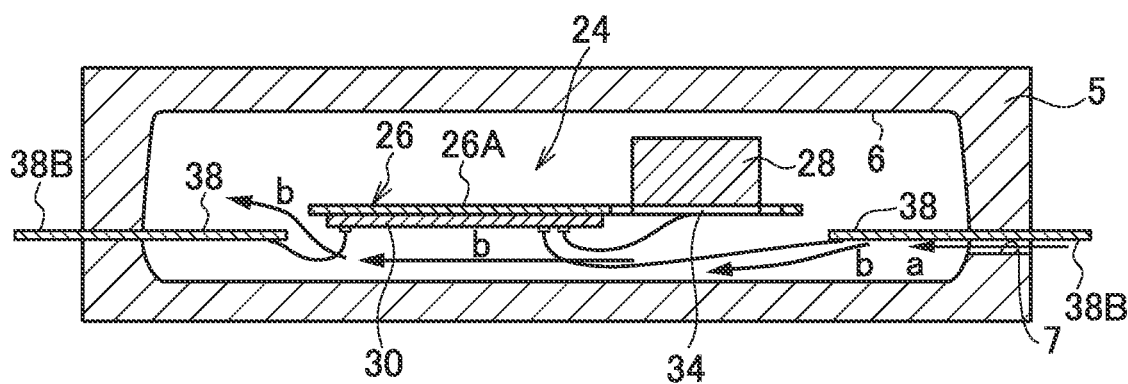

After the semiconductor device 24 is fixed inside the cavity 6, the molding resin 32 is poured in through a pouring hole 7 provided along a lower face of the leads 38, as illustrated by the arrow a in FIG. 7B. As described above, since the semiconductor device 24 is fixed such that the lead frame 26 (the die pad 26A) being positioned lower than the height direction center of the cavity 6 in the mold 5, the molding resin 32 is first poured along the lead frame 26 (the die pad 26A). Since the poured molding resin 32 has a property that tends to flow into larger space, the molding resin 32 attempts, for example, to flow above the lead frame 26 through the gap between the die pad 26A and the resin-flow-direction leading end of the leads 38. However, this route is blocked by the oscillator 28, and the molding resin 32 flows around below the lead frame 26, as illustrated by arrows b in FIG. 7C.

Figure 7D:
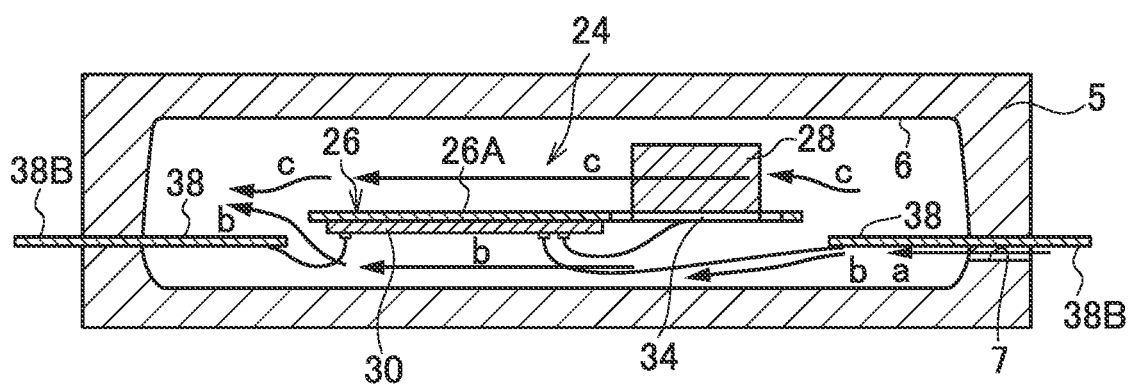

Then, as illustrated by arrows c in FIG. 7D, the molding resin 32 flows above the upper face side of the lead frame 26. After the lower face side of the lead frame 26 is filled with the molding resin 32, the upper face side of the lead frame 26 is filled with the molding resin 32.

After both sides of the lead frame 26 are filled with the molding resin 32, the mold 5 is heated and the molding resin 32 is cured.

In the semiconductor device 24, since the oscillator 28 is fixed to the upper face of the lead frame 26 (the die pad 26A) and the LSI 30 is fixed to the lower face thereof, the lead frame 26 is necessarily disposed lower than the height direction center of the cavity 6 of the mold 5 in the sealing process of the semiconductor device 24 with the molding resin 32. In such case in which a wide space is present at the upper side of the lead frame 26, the molding resin 32 tends to flow toward the upper side of the lead frame 26.

Accordingly, pressure from the molding resin 32 poured into the cavity 6 through the pouring hole 7 might not be uniformly imparted to both faces of the lead frame 26, and may be imparted more strongly to the upper face of the lead frame 26.

However, the flow path of the molding resin 32 is adjusted using the oscillator 28, such that the molding resin 32 first flows below the lead frame 26, the molding resin 32 that has flowed into the cavity 6 can be expected to serve as a bottom support for the lead frame 26. Therefore, displacement of the lead frame 26 in the up-down direction in the cavity 6 during pouring the molding resin 32 can be prevented.

Operation

Explanation next follows regarding operation of the semiconductor device 24 and operation of the integrating electricity meter 10 according to the present exemplary embodiment. In the semiconductor device 24 according to the present exemplary embodiment, the oscillator 28 and the LSI 30 are sealed and integrated together with the molding resin 32 and the LSI 30 is built-in with the oscillation circuit 51, the frequency divider circuit 53, and the timer circuit 56. Therefore, time can be measured by simply mounting the semiconductor device 24 to the base plate inside the integrating electricity meter 10 illustrated in FIG. 1. Namely, there is no need to separately provide components such as the oscillator 28 and the frequency divider circuit 53 to the base plate. Accordingly, no effort is required such as adjusting connection between the oscillator 28 and the semiconductor device 24.

Further, the temperature sensor 58 is built-in to the LSI 30, which enables the temperature of the vicinity of the oscillator 28 to be accurately measured. Therefore, frequency correction can be performed in high precision to the signal (frequency) output from the oscillator 28 even when there are fluctuations to the signal due to temperature variation. Accordingly, a frequency can be controlled in high precision even though a low cost oscillator is employed instead of a high cost high precision oscillator.

Furthermore, as illustrated in FIG. 2, the external electrodes 34 of the oscillator 28 and the oscillator electrode pads 54 of the LSI 30 are directly connected using the bonding wires 52 that pass through the openings 26C. This enables connection to be made with the shortest wiring without intervention of the lead frame 26, thereby reducing wiring resistance. Since the length of the two strands of the bonding wires 52 that connect the external electrodes 34 and the oscillator electrode pads 54 is uniform, tension in the bonding wires 52 can be made even, thereby preventing contact due to breaking or sagging of the bonding wires 52. Since the wiring can be achieved without intervention of the lead frame 26, the configuration is not susceptible to noise and a signal can be transmitted smoothly from the oscillator 28 to the LSI 30. Noise is liable to occur between bonding wires 52 that are formed parallel to each other. However, the bonding wires 52 that connect the oscillator electrode pads 54 and the external electrodes 34 are disposed in a 3-D intersection with respect to the other bonding wires 52. This configuration enables reducing interference between the bonding wires 52 that connect the oscillator electrode pads 54 and the external electrodes 34 and the other bonding wires 52, in particular, enables reducing the influence of noise from the other bonding wires 52 to the oscillator 28. Since, the external electrodes 34 are larger than the oscillator electrode pads 54, wire bonding is facilitated.

The oscillator 28 and the LSI 30 are respectively mounted to the front face and the back face of the lead frame 26, and are disposed so as to overlap with each other in a plan view projection. Therefore, the longitudinal and transverse sizes of the semiconductor device 24 can be made smaller compared to cases in which the oscillator 28 and the LSI 30 are mounted side-by-side on one face of the lead frame 26.

Since the LSI 30 is positioned at a central portion of the die pad 26A, the lengths of the bonding wires 52 that connect the electrode pads 50 and the leads 38 can be made constant. The wire bonding operation is thereby facilitated, enabling yield to be improved.

Figure 8:
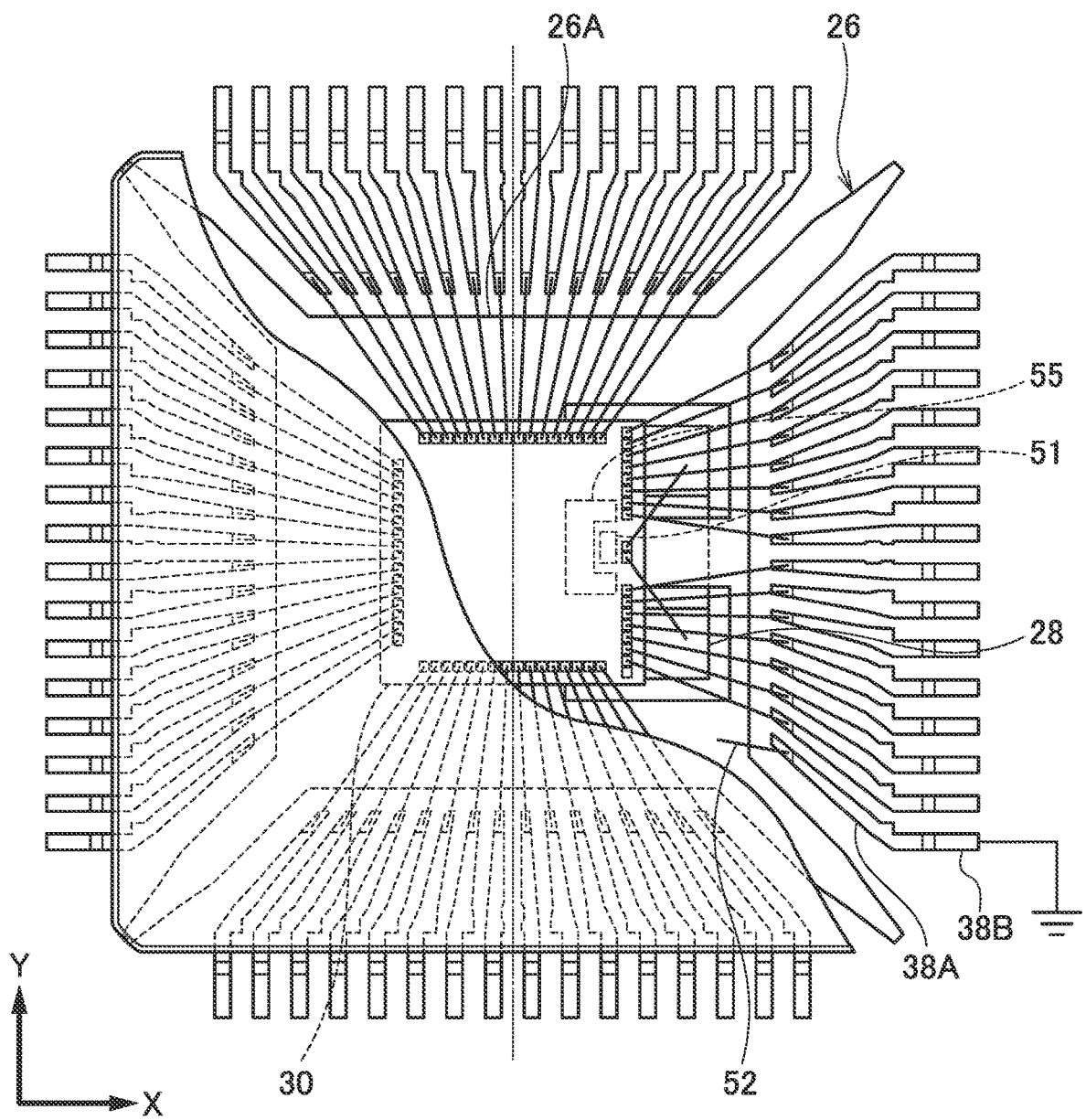
FIG. 8 is a partial cutaway diagram illustrating a modified example of a semiconductor device according to the first exemplary embodiment.

Embodiments are not limited to the present exemplary embodiment in which all of the inner leads 38A are connected to the electrode pads 50 of the LSI 30. For example, as illustrated in a modified example of FIG. 8, the die pad 26A may be earthed by connecting a given inner lead 38A to the die pad 26A using one of the bonding wires 52, and connecting the corresponding outer lead 38B to earth. Static in the die pad 26A can be suppressed in such cases. Since the LSI 30 and the oscillator 28 are respectively allocated on the two faces of the lead frame, so that the lead frame is interposed therebetween, noise from the LSI 30 to the oscillator 28 can be shielded by the die pad 26A.

In the present exemplary embodiment, the oscillation circuit 51 is disposed in the vicinity of the oscillator electrode pads 54, and a digital circuit section 55 is disposed so as to surround the oscillation circuit 51. The digital circuit section 55 is a circuit section that performs processing on digital signals, and noise is not as liable to occur as in other elements. Therefore, the influence of noise received by the oscillation circuit 51 from the other elements (in particular, from analogue circuits) that are built-in to the LSI 30 can be reduced. An example of the digital circuit section 55 includes a CPU.

Oscillation Frequency Correction

Explanation next follows regarding frequency correction processing in the semiconductor device 24 according to the present exemplary embodiment, which corrects temperature dependent errors in the oscillation frequency of the oscillator 28.

In the semiconductor device 24, for example on shipping, the temperature is measured by the temperature sensor 58 in various states, such as when the LSI 30 inside the semiconductor device 24 is at room temperature (25° C. in this case), when the LSI 30 is at a reference temperature lower than room temperature (referred to below as "low temperature") and when the LSI 30 is at a reference temperature higher than room temperature (referred to below as "high temperature"). Then, for example after shipping, the semiconductor device 24 performs error correction of the frequency of the oscillator 28 using the temperatures obtained by these measurements as trimming data, to compensate for measurement errors arising from manufacturing variation in the temperature sensor 58.

The registry section 70 described above (see FIG. 5) includes: a temperature measurement value register 71 that stores data expressing the temperature measured by the temperature sensor 58; a low temperature register 72 that stores data expressing temperature measured by the temperature sensor 58 when the surrounding (environmental) temperature is the low temperature; a room temperature register 73 that stores data expressing the temperature measured by the temperature sensor 58 when the surrounding temperature is room temperature; a high temperature register 74 that stores data expressing the temperature measured by the temperature sensor 58 when the surrounding temperature is the high temperature; and a frequency correction register 75 that stores correction values for the oscillation frequency of the oscillator 28 derived from the data expressing these temperatures. Each of the registers is connected to the controller 60 through a data bus 76, and the controller 60 performs reading from, and writing to, each of the registers through the data bus 76.

The semiconductor device 24 performs first frequency correction processing in order to correct frequency errors of the oscillator 28. The first frequency correction processing includes: measuring the temperature with the temperature sensor 58 in the state in which the semiconductor device 24 is at the low temperature, in the state in which the semiconductor device 24 is at room temperature, and in the state in which the semiconductor device 24 is at the high temperature; and storing the temperatures obtained by these measurements as trimming data in the low temperature register 72, the room temperature register 73 and the high temperature register 74, respectively.

During, for example, a shipping test, a tester (user) first places the semiconductor device 24 inside a constant temperature chamber in which the temperature inside the chamber is set at room temperature. The user then executes the first frequency correction processing in the semiconductor device 24 by, for example, inputting a measurement operation signal to start measuring the temperature using the temperature sensor 58 to the semiconductor device 24. At this time, the user may input the measurement operation signal to the semiconductor device 24 by connecting a device that outputs the measurement operation signal to the leads 38 of the semiconductor device 24. The measurement operation signal contains data indicating which temperature among the room temperature, the high temperature or the low temperature is set in the constant temperature chamber.

Figure 9:
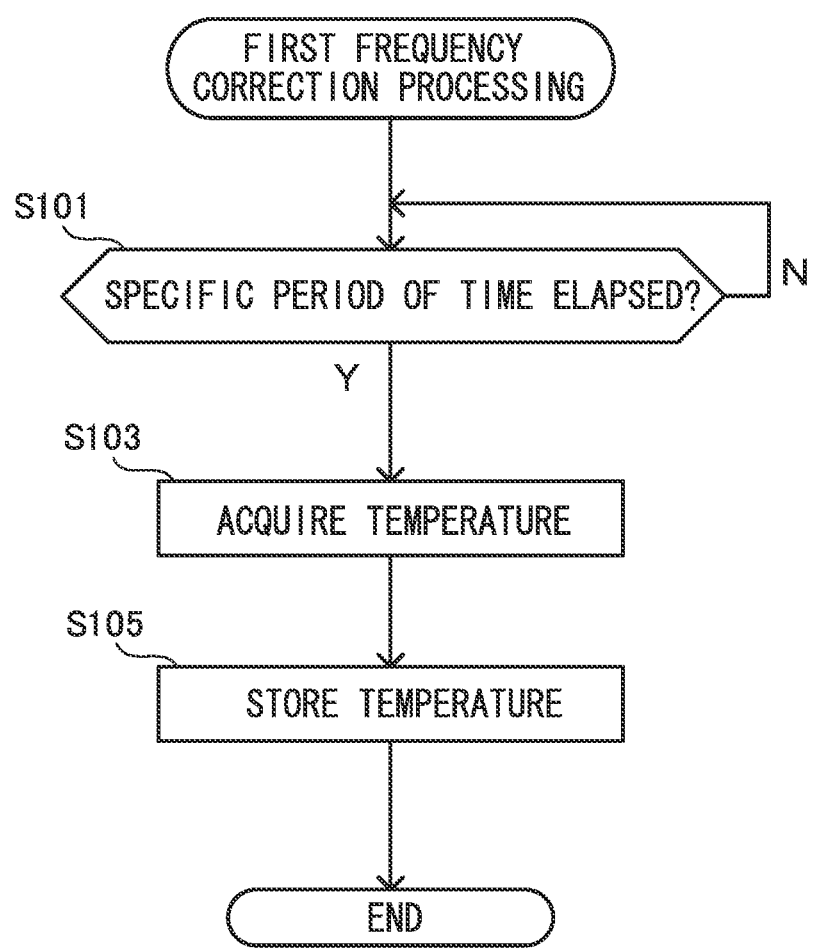
FIG. 9 is a flow chart illustrating a flow of first frequency correction processing according to the first exemplary embodiment.

FIG. 9 is a flow chart illustrating a flow of the first frequency correction processing in the semiconductor device 24 according to the present exemplary embodiment. A program of the first frequency correction processing is executed at the time when the measurement operation signal is input, and is pre-installed in a storage section of the controller 60. The execution timing of the program is not limited to above.

At step S101, the controller 60 determines whether or not a specific period of time (for example, several hours) has elapsed from input of the measurement operation signal. The specific period of time may be at least a period of time required for the internal temperature of the semiconductor device 24 (the temperature of the LSI 30) to reach the temperature of the constant temperature chamber.

If it is determined at step S101 that the specific period of time has elapsed, then at step S103, the controller 60 acquires a measurement value using the temperature sensor 58. The measurement value using the temperature sensor 58 is stored in the temperature measurement value register 71. In the acquisition of the measurement values are acquired with the temperature sensor 58, measurement may be performed each time a specific duration (for example, 1 minute) elapses, and an average value of the plural measurement values obtained by measurement plural times may be acquired as the measurement value.

At step S105, the controller 60 stores the acquired measurement value in the room temperature register 73 if the temperature set in the constant temperature chamber is room temperature (in this case 25° C.), stores the measurement value in the high temperature register 74 if the temperature set in the constant temperature chamber is the high temperature, and stores the measurement value in the low temperature register 72 if the temperature set in the constant temperature chamber is the low temperature, and then ends the first frequency correction processing. The first frequency correction processing may be performed in advance while the semiconductor device 24 is still in a wafer state.

The user performs the processing of each of the steps S101 to S105 on the semiconductor device 24 in a state in which the semiconductor device 24 is placed inside the constant temperature chamber that is set in room temperature, in a state in which the semiconductor device 24 is placed in the constant temperature chamber that is set in the high temperature, and in a state in which the semiconductor device 24 is placed in the constant temperature chamber that is set in the low temperature. The measurement values using the temperature sensor 58 are thereby respectively stored in the room temperature register 73, the high temperature register 74 and the low temperature register 72.

The semiconductor device 24 according to the present exemplary embodiment is shipped after performing the above processing, and the second frequency correction processing, described later, is performed at a predetermined timing after shipping.

A user may execute, for example after shipping, the second frequency correction processing on the semiconductor device 24, by inputting a derivation operation signal to the semiconductor device 24 for starting derivation of frequency correction values. At this time, the user may input the derivation operation signal to the semiconductor device 24 by connecting a device that outputs the derivation operation signal to the leads 38 of the semiconductor device 24. Alternatively, the semiconductor device 24 may execute the second frequency correction processing at a specific time interval.

Figure 10:
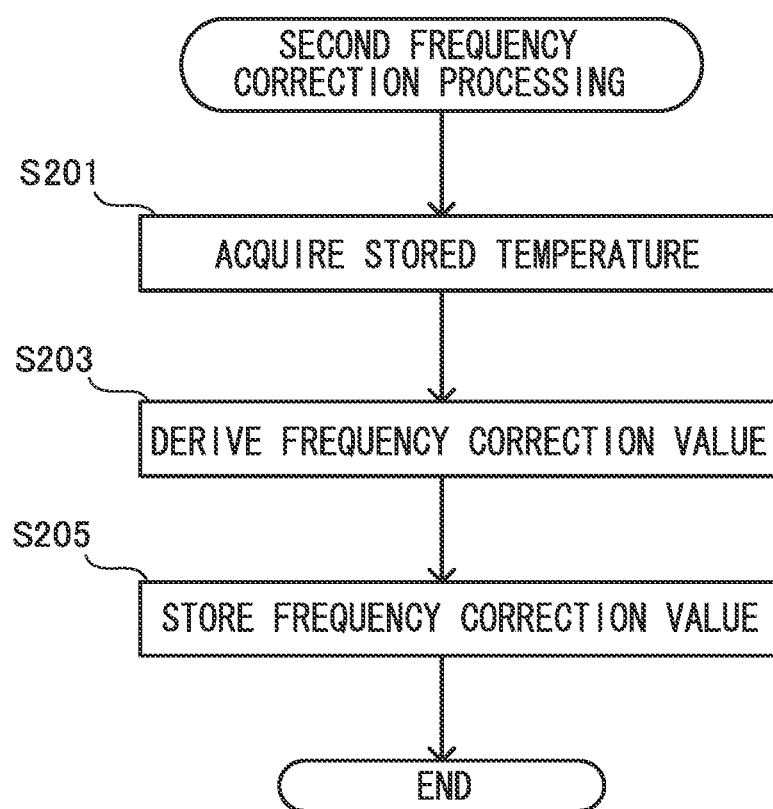
FIG. 10 is a flow chart illustrating a flow of second frequency correction processing according to the first exemplary embodiment.

FIG. 10 is a flow chart illustrating the second frequency correction processing in the semiconductor device 24 according to the present exemplary embodiment. A program of the second frequency correction processing is executed after shipping the semiconductor device 24, at a time when the derivation operation signal is input, and is pre-installed in a storage section of the controller 60.

At step S201, the controller 60 acquires the measurement values respectively stored in the room temperature register 73, the high temperature register 74 and the low temperature register 72.

At step S203, the controller 60 derives a correction value for the oscillation frequency of the oscillator 28 (referred to below as a "frequency correction value") using the measurement values acquired at step S201.

Figure 11:
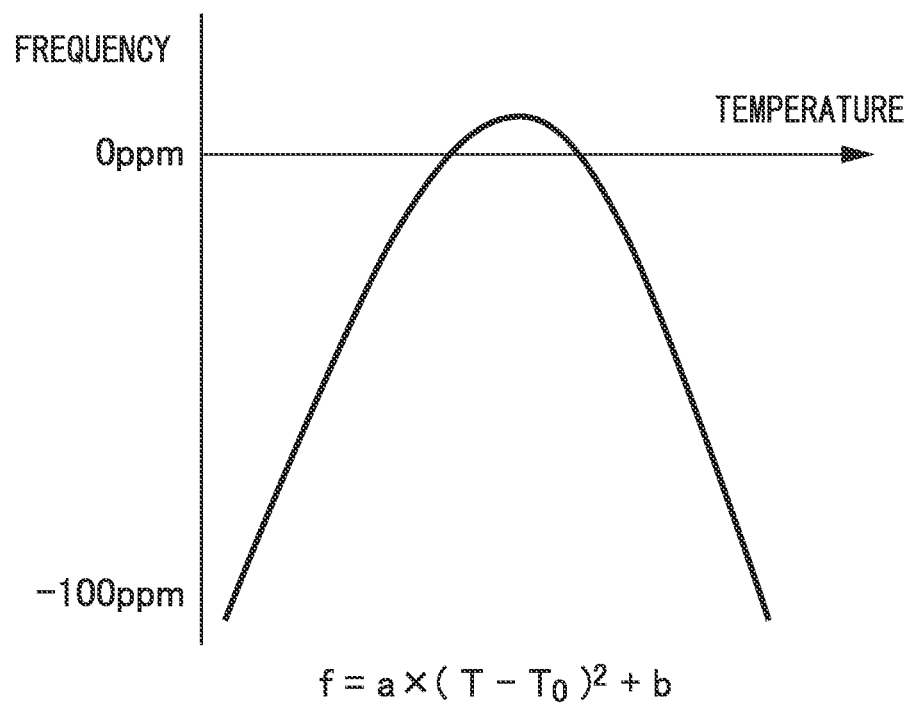
FIG. 11 is a graph illustrating a relationship between temperature and frequency deviation in the semiconductor device according to the first exemplary embodiment.

FIG. 11 is a graph illustrating a relationship between temperature and frequency deviation in a semiconductor device according to the present exemplary embodiment. FIG. 11 does not illustrate the frequency errors obtained in an actual temperature environment, but illustrates theoretical values obtained by computation using a quadratic function. This quadratic function is represented by the following Equation (1), where f is a frequency deviation, a is a second order temperature coefficient, T is the measured temperature, $T_0$ is a vertex temperature, and b is a vertex error. The second order temperature coefficient a is a constant predetermined according to individual differences in the oscillators 28, and is pre-stored in the storage section of the controller 60.

$$f = a \times (T - T_0)^2 + b \tag{1}$$

In the first exemplary embodiment, although the frequency deviation f is unknown, the vertex error b can be derived from the known second order temperature coefficient a, the measurement value at room temperature stored in the room temperature register 73, the measurement value at high temperature stored in the high temperature register 74, and the measurement value at low temperature stored in the low temperature register 72. The controller 60 takes the value of the vertex error b as the frequency correction value in order to give the smallest frequency deviation for the temperature T at room temperature.

For example, in deriving the above frequency correction value, if the measurement value by the temperature sensor 58 is −8° C. in a measurement environment of −10° C., a correction corresponding to +2° C. is required. At the product shipping stage, measurement values at three points stored in each of the registers, that are, at the room temperature, at the high temperature and at the low temperature, are read through the data bus 76, and the temperature in the actual environment is derived using the read data as trimming data. If the measurement value by the temperature sensor 58 is a value not stored in any of the registers, the nearest two register values may be employed to derive the temperature in the actual environment.

Then at step S205, the controller 60 stores data indicating the frequency correction value derived at step S203 in the frequency correction register 75. Then in the semiconductor device 24, the frequency divider circuit 53 employs the frequency correction value stored in the frequency correction register 75 to generate a clock signal from the signal input from the oscillation circuit 51, so as to perform correction on the oscillation frequency of the oscillator 28.

Thus, in the semiconductor device 24 according to the first exemplary embodiment, measurement values of the temperature sensor 58 under three environmental temperature points of the semiconductor device 24 are prepared and stored as trimming data before shipping. A frequency correction value based on high precision temperature data can be obtained without depending on manufacturing variance for each individual temperature sensor 58 of the semiconductor device 24, by deriving a frequency correction value based on the trimming data.

Figure 32:
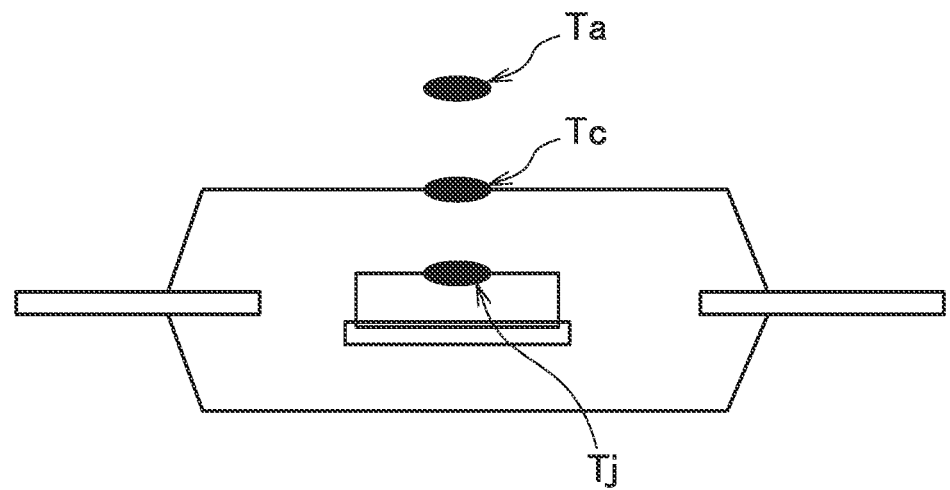
FIG. 32 is a schematic cross-section illustrating a related example of packaged generic semiconductor device.

In conventional packaged semiconductor devices, such as illustrated in FIG. 32, when the semiconductor device is driven, a surrounding temperature Ta (° C.) of the semiconductor device, a package surface temperature Tc (° C.) and a chip surface temperature Tj (° C.) are each different from each other. For example, the chip surface temperature Tj is expressed by the following Equation (2), where θja is the package thermal resistance (between junction and atmosphere) and P is the power consumption of the chip (either a maximum or average value).

$$Tj = P \times \theta ja + Ta \quad (2)$$

However, in the semiconductor device 24 according to the present exemplary embodiment, since the temperature sensor 58 and the oscillator 28 are integrated and sealed together, the surrounding temperature of the temperature sensor 58 and the surrounding temperature of the oscillator 28 will be substantially the same, and the temperature of the oscillator 28 can be measured with high precision by the temperature sensor 58 incorporated in the LSI 30. Therefore, it is possible to prevent a fall in the precision of frequency correction due to a temperature difference between the oscillator 28 and the temperature sensor 58.

Second Exemplary Embodiment

Explanation follows regarding a semiconductor device 24 according to a second exemplary embodiment. The same reference numerals are allocated to configuration similar to that of the first exemplary embodiment, and further explanation thereof will be omitted.

Figure 12:
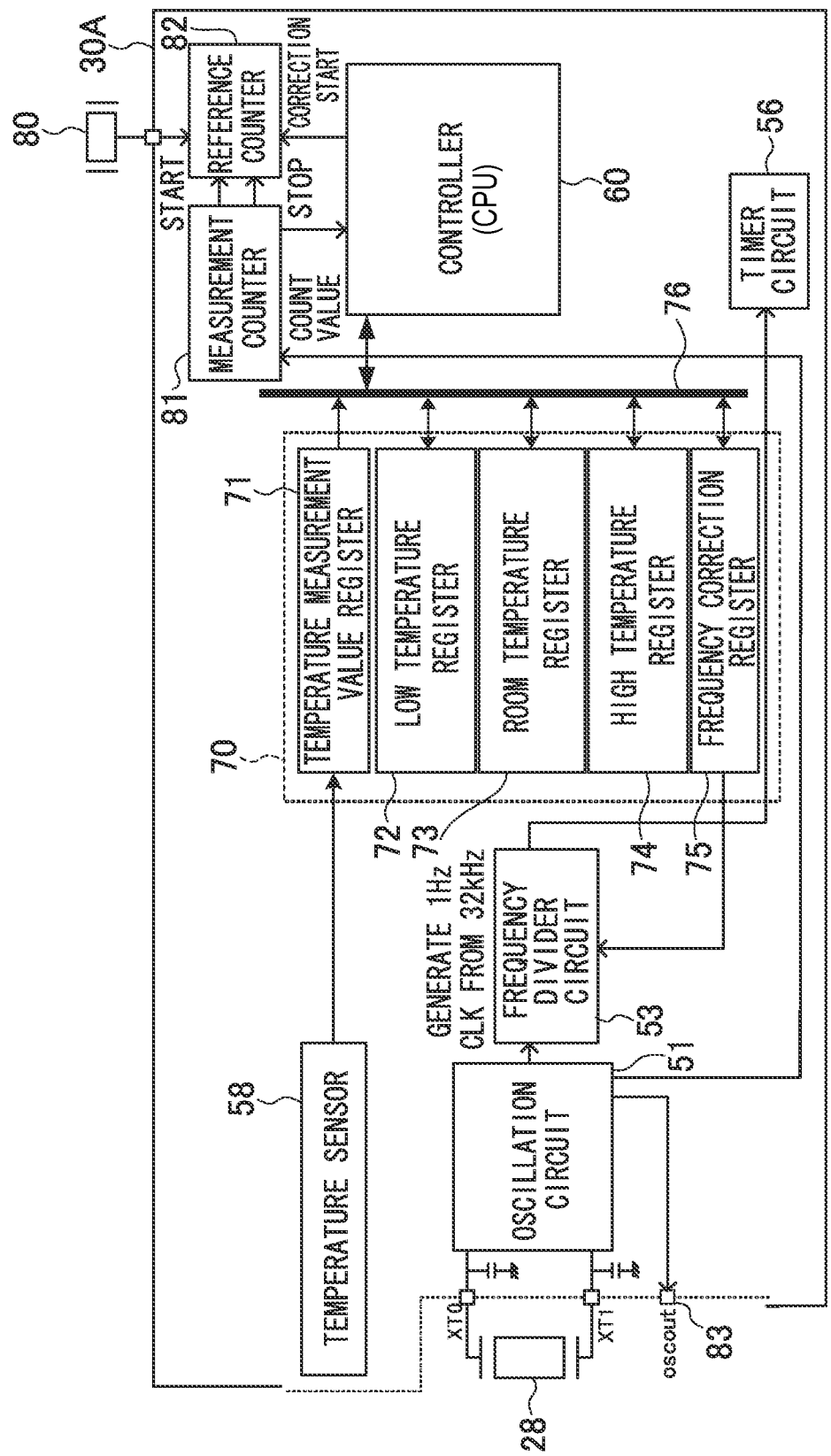
FIG. 12 is a block diagram for explaining an LSI of a semiconductor device according to a second exemplary embodiment.

As illustrated in FIG. 12, the semiconductor device 24 according to the second exemplary embodiment has a clock generation device including a reference signal oscillator 80 that is connected to an LSI 30A and inputs a clock signal (referred to below as a "reference clock signal") that acts as a reference during oscillation frequency correction of the oscillator 28. In addition to the configuration of the LSI 30 of the semiconductor device 24 according to the first exemplary embodiment, the LSI 30A of the semiconductor device 24 according to the second exemplary embodiment includes a measurement counter 81, a reference counter 82, and an output terminal 83 that outputs a clock signal from an oscillation circuit 51 to an external device.

Figure 13A:
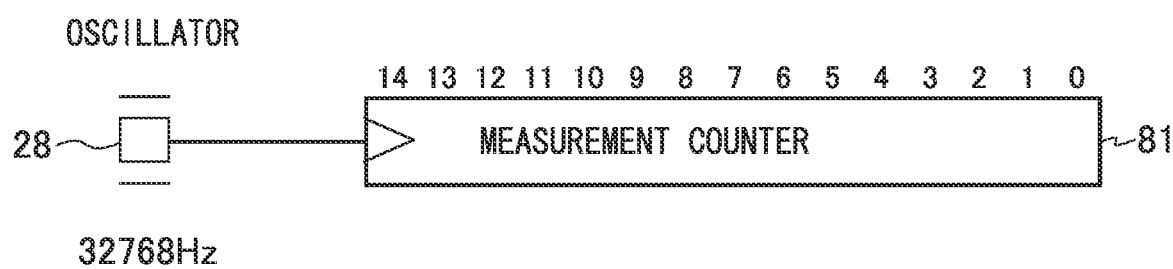
FIG. 13A is diagram illustrating an example of clock values of an oscillator of the semiconductor device according to the second exemplary embodiment.
Figure 13B:
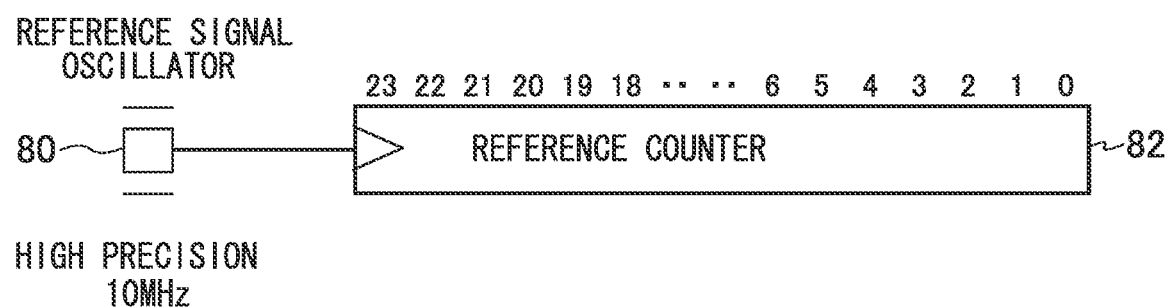
FIG. 13B is a diagram illustrating an example of clock values of a reference signal oscillator of the semiconductor device according to the second exemplary embodiment.

As illustrated in FIG. 13A and FIG. 13B, the reference signal oscillator 80 is an oscillator such as a quartz oscillator with a higher oscillation frequency than the oscillator 28. In the second exemplary embodiment, the oscillation frequency of the oscillator 28 is 32.768 kHz, and the oscillation frequency of the reference signal oscillator 80 is 10 MHz.

The measurement counter 81 is connected to the oscillation circuit 51, receives a clock signal (referred to below as a "measurement clock signal") of the oscillator 28 from the oscillation circuit 51, and counts the number of clocks of the received clock signal, under control of the controller 60. The reference counter 82 is connected to the clock generation device including the reference signal oscillator 80, receives the clock signal from the reference signal oscillator 80, and counts the number of clocks of the received clock signal, under control of the controller 60. As illustrated in FIG. 13A and FIG. 13B, the reference counter 82 and the measurement counter 81 perform counting of the number of clocks while mutually synchronized, and at substantially the same time within substantially the same time period. The measurement counter 81 and the reference counter 82 may be mutually synchronized according to an operation signal, or by employing a synchronization counter.

In the second exemplary embodiment, a registry section 70 includes: a temperature measurement value register 71 that stores data expressing the temperature measured by the temperature sensor 58; a low temperature register 72 that stores data expressing a temperature measured by the temperature sensor 58 when the surrounding temperature is a reference temperature that is a lower temperature than room temperature (25° C.) and a frequency error at this temperature; a room temperature register 73 that stores data expressing a temperature measured by the temperature sensor 58 when the surrounding temperature is room temperature (25° C.) and a frequency error at this temperature; a high temperature register 74 that stores data expressing a temperature measured by the temperature sensor 58 when the surrounding temperature is a reference temperature that is a higher temperature than room temperature (25° C.) and a frequency error at this temperature; and a frequency correction register 75 that stores data expressing frequency correction values derived from the above data expressing the frequency errors.

Oscillation Frequency Correction

During, for example, a shipping test, A user first places the semiconductor device 24 inside a constant temperature chamber in which the temperature is set at room temperature (25° C. in this case). The user then executes first frequency correction processing in the semiconductor device 24 by, for example, inputting a measurement operation signal to start measuring the temperature using the temperature sensor 58 to the semiconductor device 24. At this time, the user may input the measurement operation signal to the semiconductor device 24 by, for example, connecting a device that outputs the measurement operation signal to the leads 38 of the semiconductor device 24. The measurement operation signal contains data indicating which temperature among the room temperature, the high temperature or the low temperature is set in the constant temperature chamber.

FIG. 14 is a flow chart illustrating a flow of the first frequency correction processing in the semiconductor device 24 according to the present exemplary embodiment. A program of the first frequency correction processing is executed before shipping the semiconductor device 24 at a time when the measurement operation signal is input, and is pre-installed in a storage section of the controller 60.

At step S301, the controller 60 determines whether or not a specific period of time (for example, several hours) has elapsed from input of the measurement operation signal. The specific period of time should be at least a period of time required for the internal temperature of the semiconductor device 24 (the temperature of the LSI 30A) to reach the temperature of the constant temperature chamber.

If it is determined at step S301 that the specific period of time has elapsed, then at step S303, the controller 60 acquires a measurement value using the temperature sensor 58. The measurement value using the temperature sensor 58 is stored in the temperature measurement value register 71. The temperature sensor 58 has been confirmed by testing to have a measurement accuracy of a predetermined reference value or better, and it is guaranteed that temperature measurements can be performed in high precision with the temperature sensor 58. Alternatively, correction of the temperature sensor 58 may be performed using the measurement values by the temperature sensor 58.

At step S305, the controller 60 performs frequency error derivation processing that derives errors in the oscillation frequency of the oscillator 28. FIG. 15 is a flow chart illustrating a flow of the frequency error derivation processing according to the present exemplary embodiment. FIG. 16A is a diagram illustrating a timing chart of the frequency error derivation processing according to the present exemplary embodiment when counting is started. FIG. 16B is a diagram illustrating a timing chart of the frequency error derivation processing when counting is stopped.

At step S401, the controller 60 outputs a correction operation signal to the measurement counter 81. The measurement counter 81 input with the correction operation signal then starts operation at step S403 so as to start counting clock values of the clock signal from the oscillator 28 and to output a start signal to the reference counter 82.

At step S405, the reference counter 82 that has received the start signal starts counting clock values of the clock signal from the reference signal oscillator 80. Namely, as illustrated in FIG. 16A, the measurement counter 81 starts counting when the correction operation signal switches ON, and the reference counter 82 also starts counting in synchronization with the measurement counter 81.

At step S407, it is determined whether or not the count value of the measurement counter 81 is a predetermined specific value (in the present exemplary embodiment 32,768 per second) or greater. The measurement counter 81 continues counting if it is determined that the count value is the specific value or greater at step S407.

If it is determined that the count value is the specific value or greater at step S407, then at step S409, the measurement counter 81 stops counting and also outputs a stop signal to the reference counter 82.

The reference counter 82 that has received the stop signal then stops counting at step S411. Namely, as illustrated in FIG. 16B, the measurement counter 81 stops counting when the correction operation signal switches OFF, and the reference counter 82 also stops counting in synchronization with the measurement counter 81.

At step S413, the controller 60 acquires the count value of the reference counter 82.

At step S415, the controller 60 derives an error in oscillation frequency of the oscillator 28 based on the count value of the reference counter 82 acquired at step S413. Namely, the controller 60 derives the error in the oscillation frequency of the oscillator 28 by comparing the count value (that is, 32,768) obtained within a period of time in the measurement clock signal from the oscillator 28 with the count value obtained within the same period of time in the reference clock signal from the reference signal oscillator 80 that is capable of timing at a higher accuracy than the oscillator 28.

For example, since the oscillation frequency of the reference signal oscillator 80 is 10 MHz, if the count value of the reference counter 82 is "10,000,000 (in decimal numbering)", it is estimated that the oscillator 28 has accurately timed one second. In this case the error in the oscillation frequency is 0, and there is no need to perform correction, and the error of the oscillation frequency (frequency correction value) is set to 0. However, if the count value of the reference counter 82 is "10,000,002 (in decimal numbering)", it is estimated that the oscillation frequency of the oscillator 28 is 0.2 ppm slow. Therefore, the oscillation frequency of the oscillator 28 needs to be corrected by this error amount, namely, needs to be speeded up by 0.2 ppm, and the error of the oscillation frequency (frequency correction value) is set to +0.2 ppm. As a further example, if the count value of the reference counter 82 is "9,999,990 (in decimal numbering)", the oscillation frequency of the oscillator 28 is estimated to be fast by 1.0 ppm. Therefore, the oscillation frequency of the oscillator 28 needs to be corrected by this error amount, namely, needs to be slowed by 1.0 ppm, and the error of the oscillation frequency (the frequency correction value) is set to −1.0 ppm.

At step S417, the controller 60 stops the correction operation signal from being output from the measurement counter 81, and ends the frequency error derivation processing program. The measurement counter 81 and the reference counter 82 stop operating when input of the correction operation signal ceases.

At step 307, the controller 60 stores the measurement value of the temperature acquired at step S303 and the frequency error derived at step S415. These are stored in the room temperature register 73 when the temperature in the constant temperature chamber is set at room temperature, in the high temperature register 74 when the temperature in the constant temperature chamber is set at high temperature, and in the low temperature register 72 when the temperature in the constant temperature chamber is set at low temperature. Then, the first frequency correction processing is ended.

The user performs the processing of each of the steps S301 to S309 on the semiconductor device 24 in a state in which the semiconductor device 24 is placed inside the constant temperature chamber that is set in room temperature, in a state in which the semiconductor device 24 is placed in the constant temperature chamber that is set in the high temperature, and in a state in which the semiconductor device 24 is placed in the constant temperature chamber that is set in the low temperature. The measurement values using the temperature sensor 58 and the error in the oscillation frequency of the oscillator 28 are thereby respectively stored in the room temperature register 73, the high temperature register 74 and the low temperature register 72.

The semiconductor device 24 according to the present exemplary embodiment is shipped after the above processing has been performed, and the oscillation frequency of the oscillator 28 is corrected according to above Equation (1) at a predetermined timing after shipping using the data expressing the frequency correction values stored in the frequency correction register 75. In the second exemplary embodiment the second order temperature coefficient a, and the vertex error b are determined based on the derived frequency errors for each of the temperatures. These values may be derived by a straight line approximation using the difference in values of the oscillation frequency errors stored in a register of higher temperature and a register of lower temperature than the temperature at which frequency error determination is desired. Then second frequency correction processing, described later, that corrects the oscillation frequency of the oscillator 28 using the above Equation (1) is performed at the time of a system reset and/or periodically, or in response to input of a specific signal through the leads 38.

A user may execute the second frequency correction processing on the semiconductor device 24, by, for example, inputting a derivation operation signal to the semiconductor device 24 for starting derivation of frequency correction values. At this time, the user may input the derivation operation signal by, for example, connecting a device that outputs the derivation operation signal to the leads 38 of the semiconductor device 24.

Figure 17:
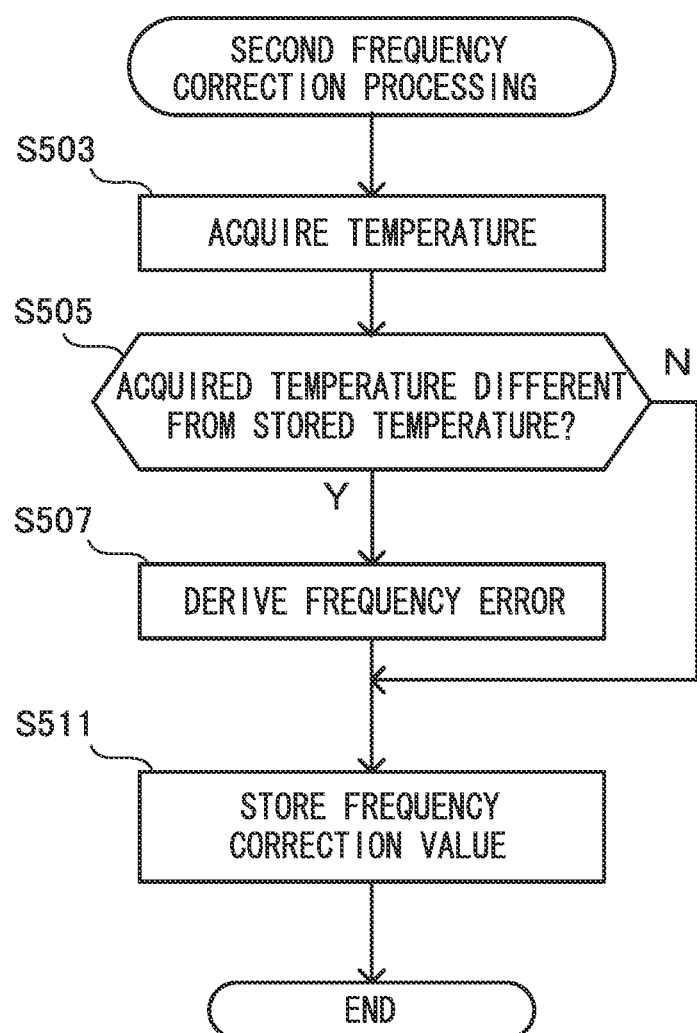
FIG. 17 is a flow chart illustrating a flow of second frequency correction processing according to the second exemplary embodiment.

FIG. 17 is a flow chart illustrating the second frequency correction processing in the semiconductor device 24 according to the present exemplary embodiment. A program of the second frequency correction processing is executed at a time when the derivation operation signal is input, and is pre-installed in a storage section of the controller 60.

At step S503, the controller 60 measures the current surrounding (environment) temperature using the temperature sensor 58 and acquires the measurement values. The measurement value by the temperature sensor 58 is stored in the temperature measurement value register 71.

At step S505, the controller 60 determines whether or not the temperature acquired at step S503 is different from the temperature measured in the constant temperature chamber (for example the temperature acquired at step S303). This step is optional, and if such determination is not required, after step S503, processing may transition to step S507 without performing the processing of step S505.

At step S505, if it is determined that the temperature is not different, the controller 60 determines that there is no need to change the frequency correction value, and ends the second frequency correction processing.

If it is determined that the temperature is different at step S505, at step S507 the controller 60 derives a frequency error by performing similar processing to that of step S305. Further, at step S507, the controller 60 substitutes data stored in each of the registers of the registry section 70 in above Equation (1) in order to derive the second order temperature coefficient a and the vertex error b.

At step S511, the controller 60 stores the frequency correction value in the frequency correction register 75. If it has been determined at step S505 that the temperature is not different, the temperature and the frequency errors stored in the low temperature register 72, the room temperature register 73 and the high temperature register 74 are employed to derived the frequency correction value, which is then stored in the storage section. However, if it has been determined at step S505 that the temperature is different, the frequency error derived at step S507 is employed to derived the frequency correction value, which is then stored in the storage section.

In the semiconductor device 24, the frequency divider circuit 53 corrects the signal input from the oscillation circuit 51 based on the frequency correction value stored in the frequency correction register 75, whereby correction of the oscillation frequency of the oscillator 28 is performed.

As described above, since the semiconductor device 24 according to the second exemplary embodiment measures the frequency error at the actual temperature, it is possible to keep stable timing even if there are differences in the frequency deviation due to temperature resulting from manufacturing variation in the oscillator 28.

Since a time correction circuit is built in the LSI 30A of the semiconductor device 24 according to the second exemplary embodiment, time measurements can be performed at high precision even if the frequency precision in the clock signal supplied from an external device is low.

Further, in the semiconductor device 24 according to the second exemplary embodiment, a terminal that becomes free due to building in the oscillator 28 can be diverted to a separate function (for example, additional serial communication or I2C). Therefore, functionality of the semiconductor device 24 can be increased even though the number of terminals is limited.

The error derivation method is not limited to that employed in the present exemplary embodiment, that is, using the reference signal oscillator 80, the measurement counter 81 and the reference counter 82 to derive the error in the oscillation frequency of the oscillator 28. Alternatively, an actual timing of a specific period of time by the oscillator 28 may be measured by comparing the specific period of time (in the present exemplary embodiment, one second (32,768 CLK)) that has been timed by the clock signal output from an oscout terminal of the oscillation circuit 51 with the specific period of time measured accurately by another method.

In addition to performing error correction on the oscillation frequency of the oscillator 28 in the semiconductor device 24 according to the second exemplary embodiment, correction considering the measurement error of the temperature sensor 58 in the semiconductor device 24 according to the first exemplary embodiment may also be performed.

Figure 18:
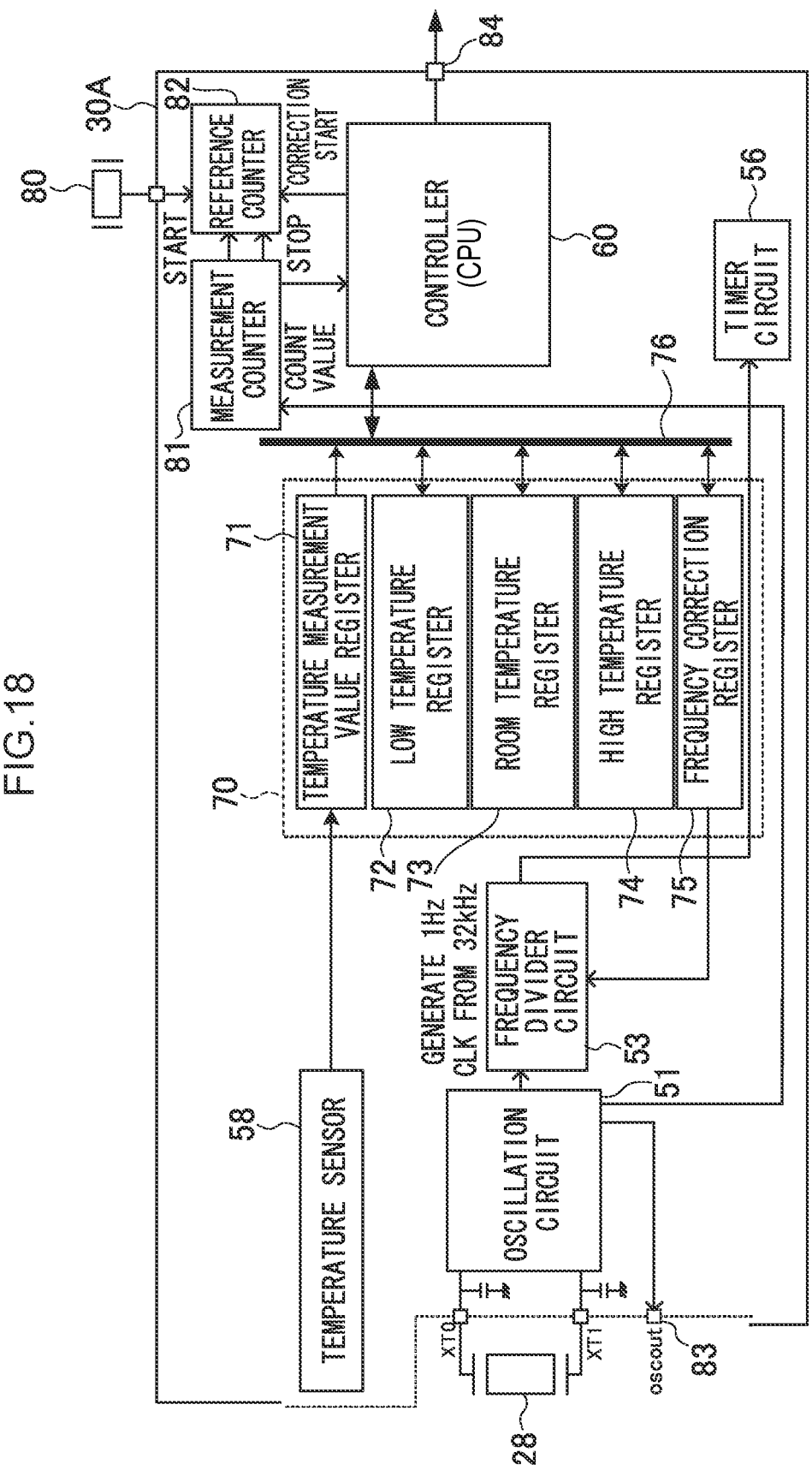
FIG. 18 is a block diagram for explaining another example of an LSI of the semiconductor device according to the second exemplary embodiment.
Figure 19:
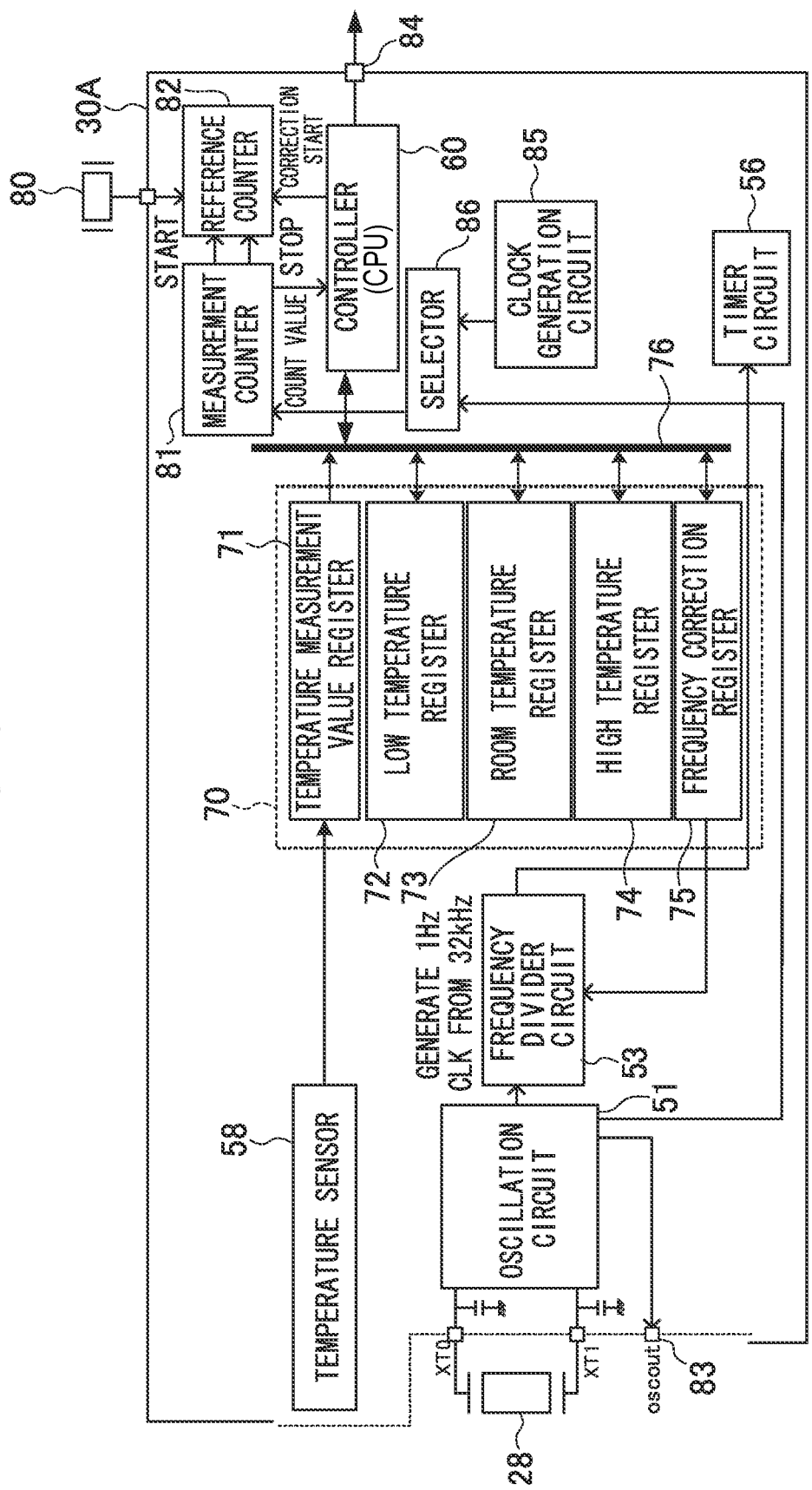
FIG. 19 is a block diagram for explaining another example of an LSI of the semiconductor device according to the second exemplary embodiment.

FIG. 18 and FIG. 19 are block diagrams illustrating other examples of electrical configurations of the LSI 30A of the semiconductor device 24 according to the present exemplary embodiment.

As illustrated in FIG. 18, the semiconductor device 24 may include an output terminal 84, and the error in the oscillation frequency of the oscillator 28 (the frequency correction value) derived by the controller 60 may be output to an external device from the semiconductor device 24 through the output terminal 84. This configuration enables to perform regular calibration in order to discover deterioration in the characteristics of the reference clock generation device.

As illustrated in FIG. 19, a high precision clock generation circuit 85 that serves as a calibration reference may be connected to the measurement counter 81 the LSI 30A of the semiconductor device 24 to act for. In such cases, at the above step S413, the controller 60 acquires the count value of the measurement counter 81 and the count value of the reference counter 82, and compares the count value of the measurement counter 81 with the count value of the reference counter 82. For example, given that the frequency of the clock signal of the measurement counter 81 is 10 MHz, and the frequency of the clock generation circuit 85 connected to the measurement counter 81 is 10 MHz. Then, the count value of the measurement counter 81 and the count value of the reference counter 82 will be the same value if the clock generation device including the reference signal oscillator 80 and the clock generation circuit 85 connected to the measurement counter 81 generate clock signals having the same frequency. However, if the characteristics of the reference signal oscillator 80 have varied, there will be a difference between the count value of the measurement counter 81 and the count value of the reference counter 82. If there is a difference between the count value of the measurement counter 81 and the count value of the reference counter 82, the controller 60 may determines whether or not the difference is within a predetermined permissible error range, and may output the determination result to the output terminal 84. Thus, regular calibration can be performed in order to discover deterioration in the characteristics of the clock generation device including the reference signal oscillator 80.

As illustrated in FIG. 19, in cases in which the clock generation circuit 85 is built into the LSI 30A of the semiconductor device 24, a selector 86 may be provided in the LSI 30A, to which one of the clock signal output from the oscillation circuit 51 or the clock signal output from the clock generation circuit 85 is selectively input, and which outputs the selected one to the measurement counter 81. The semiconductor device 24 illustrated in FIG. 19 can operate similarly to the semiconductor device 24 illustrated in FIG. 18 due to providing the selector 86.

Third Exemplary Embodiment

Figure 20:
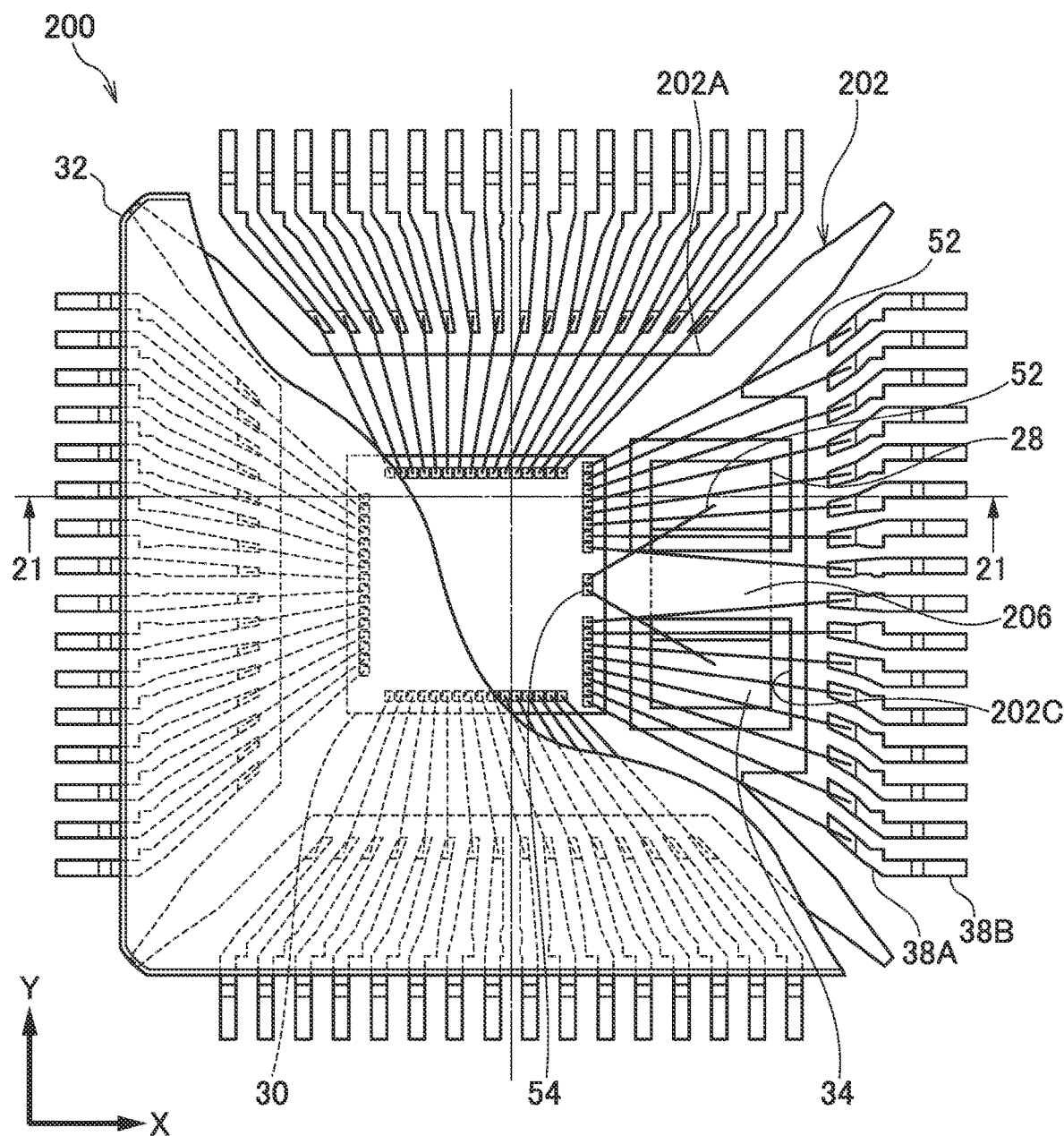
FIG. 20 is a partial cutaway diagram of a semiconductor device according to a third exemplary embodiment, as viewed from the back face.
Figure 21:
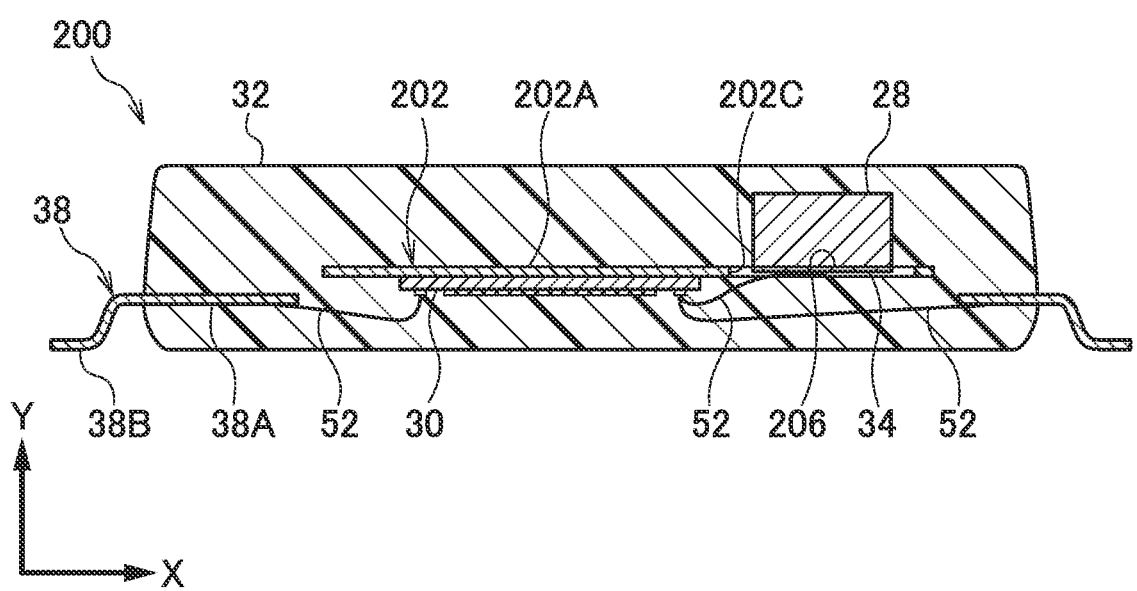
FIG. 21 is a cross-sectional view taken on line 21-21 of FIG. 20.

Explanation next follows regarding a semiconductor device 200 according to a third exemplary embodiment. Configuration that is similar to that of the first exemplary embodiment is allocated the same reference numerals and explanation is omitted thereof. As illustrated in FIG. 20 and FIG. 21, an oscillator 28 is mounted through a bonding agent to an oscillator mounting beam 206 on a front face of a lead frame 202 that configures the semiconductor device 200 according to the present exemplary embodiment. An LSI 30 is mounted through a bonding agent to a die pad 202A on the back face of the lead frame 202.

The LSI 30 is mounted on the die pad 202A such that it is displaced to the left side than the central portion of the die pad 202A without overlapping with opening sections 202C formed in the die pad 202A. Therefore, the entire face of the LSI 30 is accordingly bonded to the die pad 202A.

The procedure of configuring the semiconductor device 200 including fixing the oscillator 28 to a first face of the die pad 202A, fixing the LSI 30 to a second face that is the opposite side to the first face, and connecting oscillator electrode pads 54 of the LSI 30 and external electrodes 34 of the oscillator 28, and connecting electrode pads 50 of the LSI 30 and inner leads 38A using bonding wires 52, is similar to that of the semiconductor device 24 of the first exemplary embodiment, as illustrated in FIG. 6A to FIG. 6E. The procedure of sealing the semiconductor device 200 with a molding resin 32 is also similar as illustrated in FIG. 7A to FIG. 7D.

In the semiconductor device 200 according to the present exemplary embodiment, the bonding strength of the LSI 30 is increased in comparison with the semiconductor device 24 of the first exemplary embodiment. Further, since the whole faces of the external electrodes 34 of the oscillator 28 are exposed, the oscillator electrode pads 54 and the external electrodes 34 can be easily connected using the bonding wires 52.

Fourth Exemplary Embodiment

Figure 22:
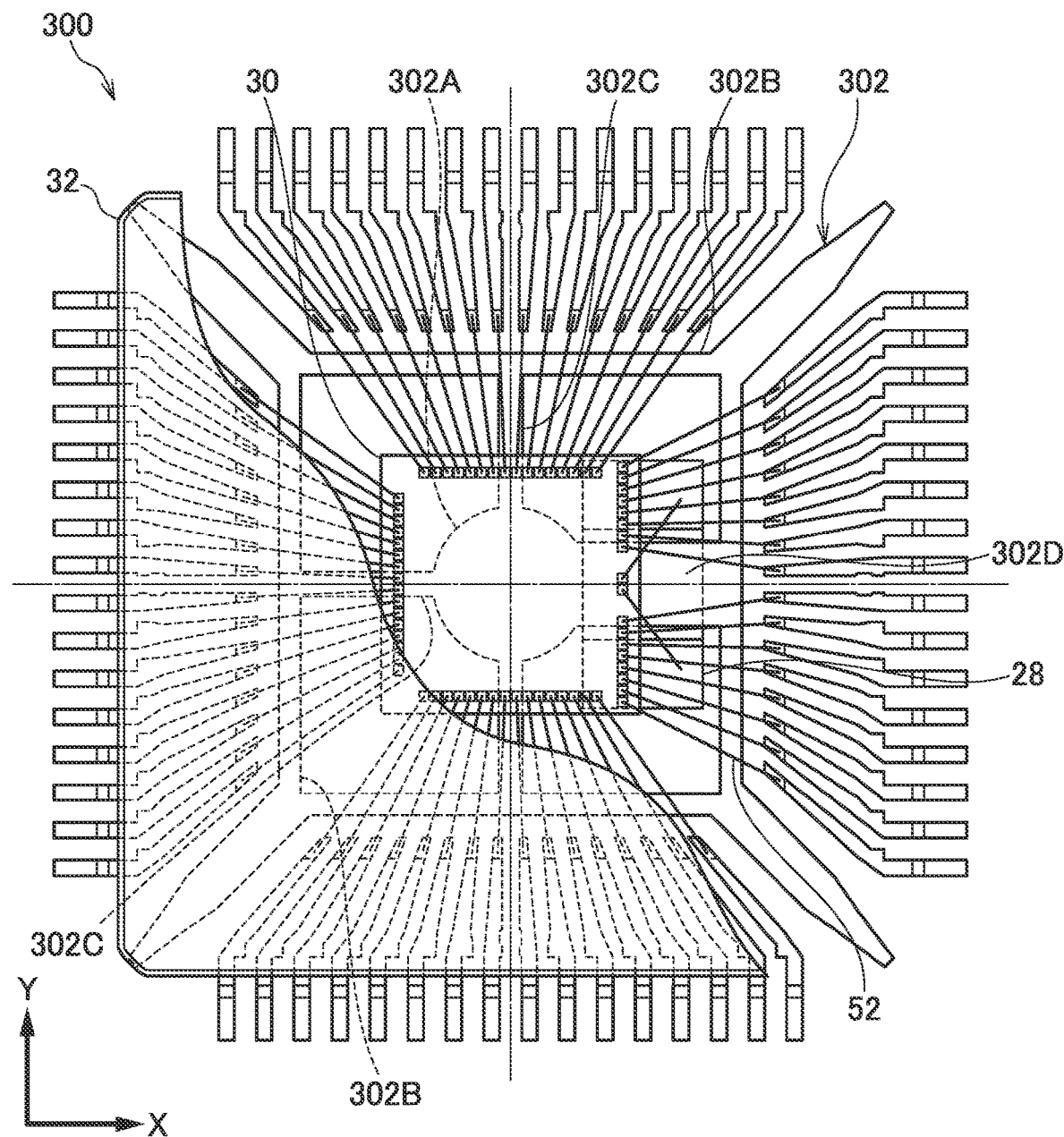
FIG. 22 is a partial cutaway diagram illustrating a semiconductor device according to a fourth exemplary embodiment, as viewed from the back face.
Figure 23:
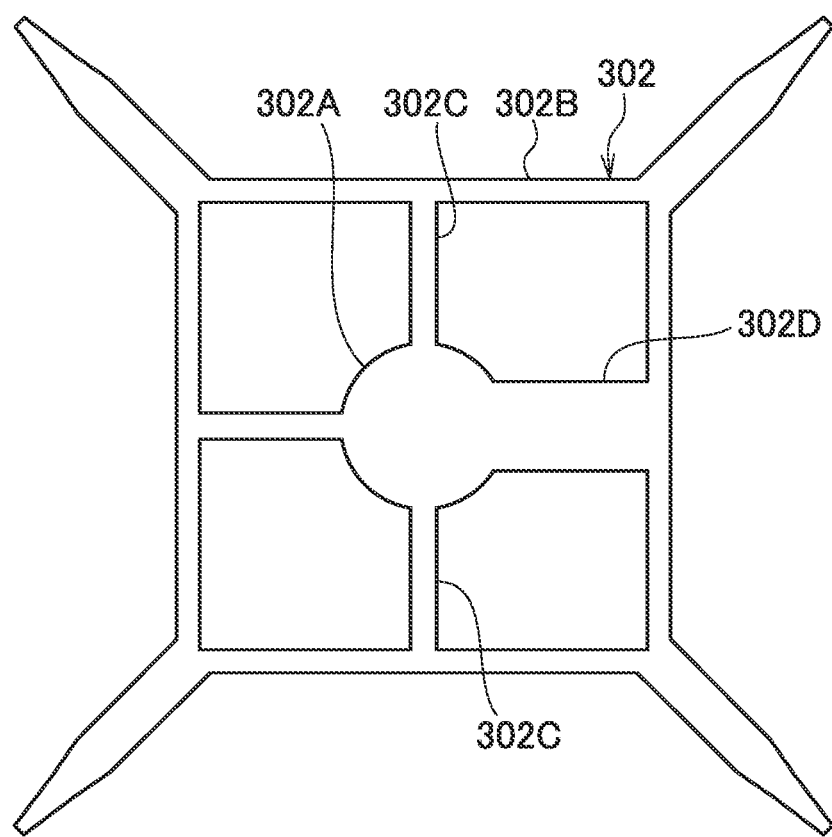
FIG. 23 is an explanatory diagram for explaining a lead frame of the semiconductor device according to the fourth exemplary embodiment.

Explanation follows regarding a semiconductor device 300 according to a fourth exemplary embodiment. Configuration that is similar to that of the first exemplary embodiment is allocated the same reference numerals and explanation is omitted thereof. As illustrated in FIG. 22 and FIG. 23, a lead frame 302 of the semiconductor device 300 according to the present exemplary embodiment is configured with support beams 302C and an oscillator mounting beam 302D spanning between a circular shaped die pad 302A and an outer frame portion 302B provided at the peripheral outside of the die pad 302A.

The die pad 302A is positioned at the center portion of the lead frame 302, and is smaller than the LSI 30 that is mounted to the back face of the die pad 302A. The support beams 302C extend towards the top, bottom and left side of the die pad 302A in FIG. 22, and the oscillator mounting beam 302D extends towards the right side of the die pad 302A. The oscillator mounting beam 302D is formed so as to have a wider width than the support beams 302C, and the width of the oscillator mounting beam 302D is formed narrower than a distance between the external electrodes 34 of the oscillator 28, and the oscillator 28 is mounted thereto through a bonding agent.

The procedure of configuring the semiconductor device 300 including fixing the oscillator 28 to a first face of the die pad 302A, fixing the LSI 30 a second face that is the opposite side to the first face, and connecting oscillator electrode pads 54 of the LSI 30 and external electrodes 34 of the oscillator 28, and connecting electrode pads 50 of the LSI 30 and leads 38 using bonding wires 52, is similar to that of the semiconductor device 24 of the first exemplary embodiment, as illustrated in FIG. 6A to FIG. 6E. The procedure of sealing the semiconductor device 300 with a molding resin 32 is also similar as illustrated in FIG. 7A to FIG. 7D.

In the semiconductor device 300 according to the present exemplary embodiment, the die pad 302A is formed as small as possible, and the outside of the die pad 302A is punched out. Therefore, it is possible to save in the material cost for the lead frame 302 compared to the semiconductor device 24 according to the first exemplary embodiment.

Further, since the die pad 302A is made small, the contact surface area between the molding resin 32 and the LSI 30 is larger than in the first exemplary embodiment. The adhesion force of the molding resin 32 to the LSI 30 is greater than the adhesion force between the LSI 30 and the die pad 302A and, therefore, the LSI 30 is rendered less liable to peel off as the contact surface area between the molding resin 32 and the LSI 30 is increased. In particular, in cases in which the semiconductor device 300 is mounted onto a board by reflow or the like, the semiconductor device 300 is heated and there are concerns that the adhesion force between the die pad 302A and the molding resin 32 might decrease. However, adhesion force can be maintained even in cases in which the semiconductor device 300 is heated by making the die pad 302A smaller and making the contact surface area between the molding resin 32 and the LSI 30 larger.

Moreover, the support beams 302C and the oscillator mounting beam 302D are disposed inside the outer frame portion 302B in a cross shape (lattice shape), and the oscillator 28 is mounted so as to orthogonally intersect with the oscillator mounting beam 302D. Therefore, contact and shorting between the support beams 302C and the external electrodes 34 of the oscillator 28 can be prevented. In another embodiment, the support beams 302C supporting the die pad 302A may be eliminated, and the outer frame portion 302B and the die pad 302A may be coupled together only by the oscillator mounting beam 302D in a cantilever manner.

Fifth Exemplary Embodiment

Figure 24:
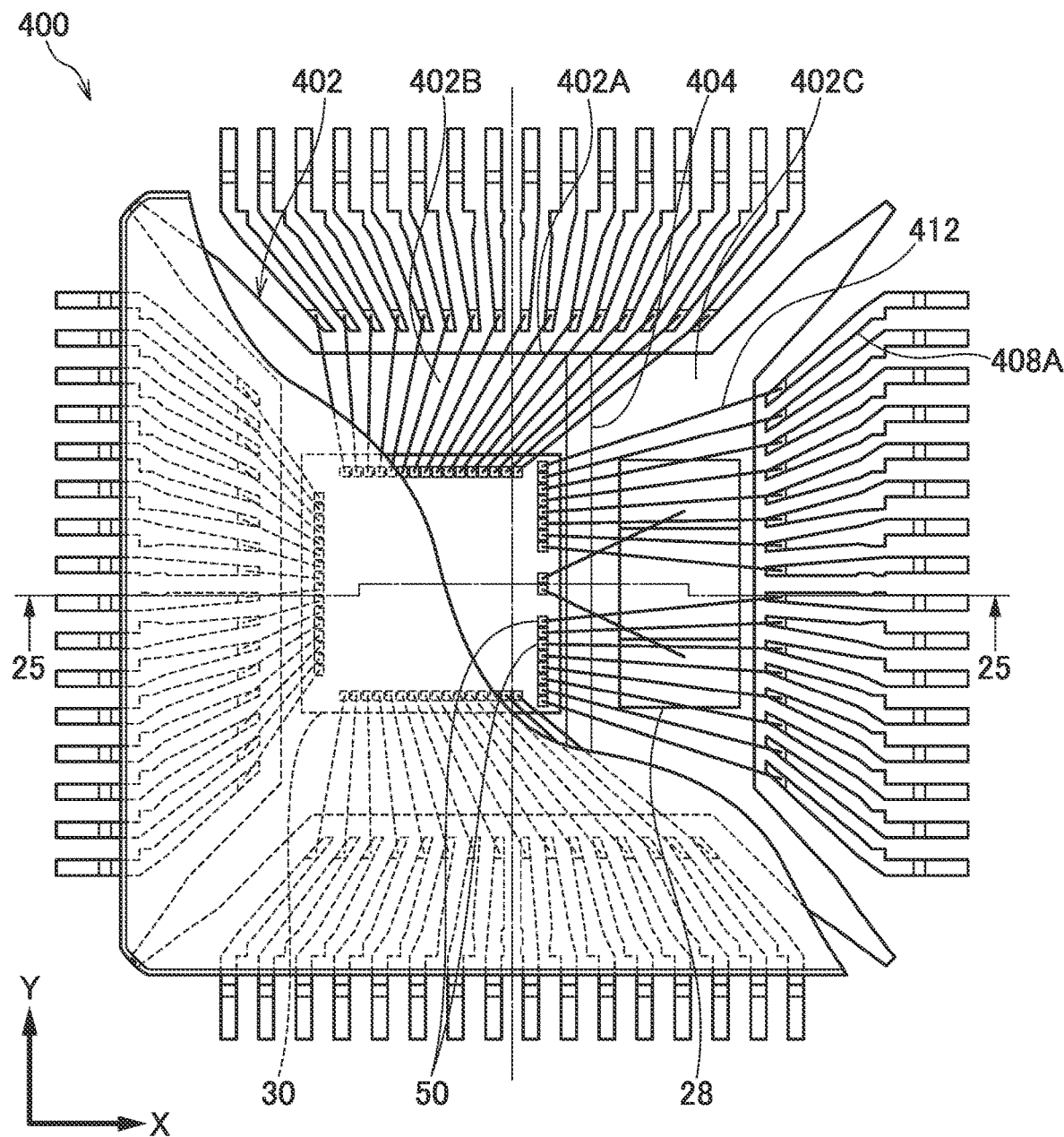
FIG. 24 is a partial cutaway diagram illustrating a semiconductor device according to a fifth exemplary embodiment, as viewed from the back face.
Figure 25:
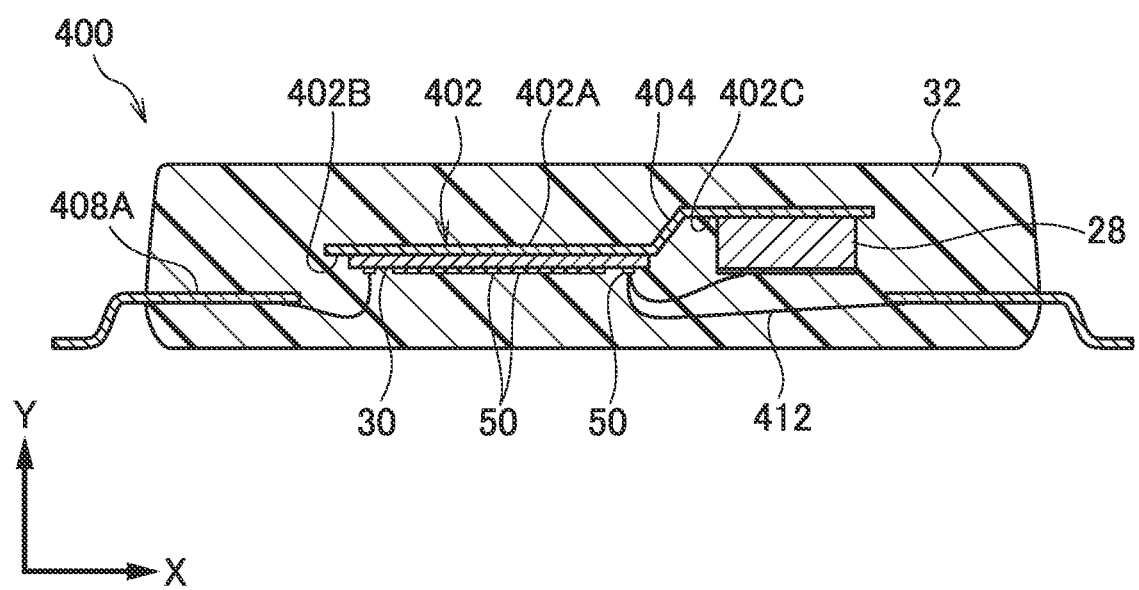
FIG. 25 is a cross-sectional view taken on line 25-25 of FIG. 24.

Explanation follows regarding a semiconductor device 400 according to a fifth exemplary embodiment. Configuration that is similar to that of the first exemplary embodiment is allocated the same reference numerals and explanation is omitted thereof. As illustrated in FIG. 24 and FIG. 25, a stepped portion 404 is provided to a die pad 402A positioned at a center portion of a lead frame 402 according to the present exemplary embodiment. The stepped portion 404 extends along the up-down direction of the die pad 402A in FIG. 24, and is sloped upwards from the left towards the right as illustrated in FIG. 25. The die pad 402A can be accordingly divided into a lower positioned first mounting face 402B and an upper positioned second mounting face 402C, with the stepped portion 404 as the boundary therebetween.

The first mounting face 402B and the second mounting face 402C are provided contiguously on the back face of the lead frame 402, and are formed parallel to inner leads 408A. An LSI 30 is mounted to the first mounting face 402B through a bonding agent, and electrode pads 50 provided to the lower face of the LSI 30 and the inner leads 408A are electrically connected by bonding wires 412.

An oscillator 28 is mounted to the second mounting face 402C through a bonding agent. The second mounting face 402C is accordingly positioned above the first mounting face 402B by the difference in the thicknesses of the LSI 30 and the oscillator 28, and the lower face of the LSI 30 and the lower face of the oscillator 28 are positioned at the same height as each other.

As illustrated in FIG. 25, the bonding wires 412 that connect the electrode pads 50 and the inner leads 408A are formed so as to straddle the bonding wires 412 that connected the oscillator electrode pads 54 and the external electrodes 34. Namely, in order to prevent shorting of the bonding wires 412, the apexes of the bonding wires 412 that connect the oscillator electrode pads 54 and the external electrodes 34 are made to be lower (less far away from the lead frame 402) than the apex of the bonding wires 412 that connect the electrode pads 50 and the inner leads 408A.

Manufacturing Procedure

Explanation follows regarding a manufacturing procedure of the semiconductor device 400.

Figure 26A:
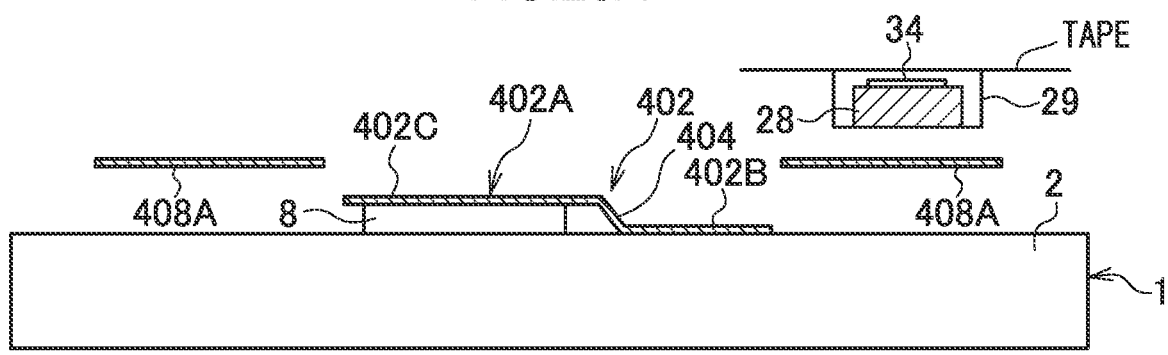
FIG. 26A to FIG. 26E are explanatory diagrams illustrating a wire bonding procedure for disposing an oscillator and an LSI on a lead frame in a manufacturing method for manufacturing the semiconductor device according to the fifth exemplary embodiment.

First, as illustrated in FIG. 26A, the lead frame 402 is placed on a mounting block 2 of a bonding apparatus 1 such that the inner leads 408A are positioned upwards and the die pad 402A is positioned lower. A step 8 is formed on the mounting block 2 so as to hold the portion at which the second mounting face 402C of the die pad 402A is formed. In this state, the first mounting face 402B and the second mounting face 402C both face upwards. The oscillator 28 is conveyed in a state in which it is sealed in a package 29 on a tape and the external electrodes 34 faces upwards. The stepped portion 404 is pre-formed in the lead frame 402 by a process such as pressing.

Figure 26B:
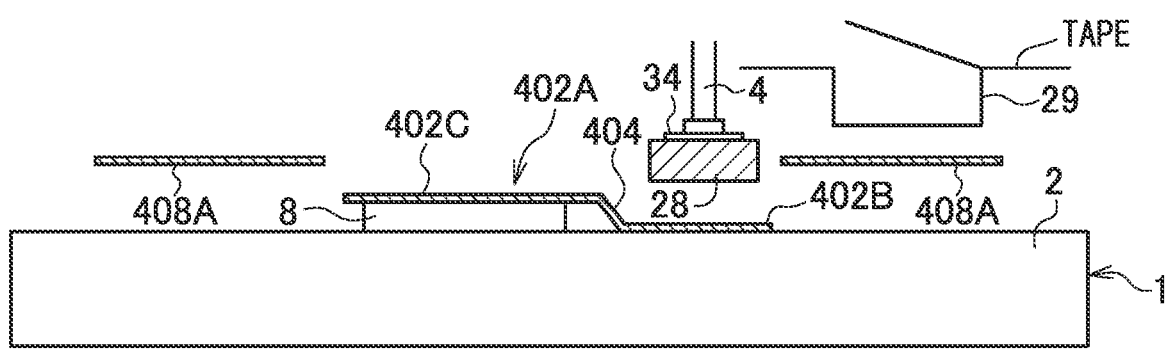

Next, as illustrated in FIG. 26B, the package 29 is unsealed, and the oscillator 28 is taken out with a picker 4.

Figure 26C:
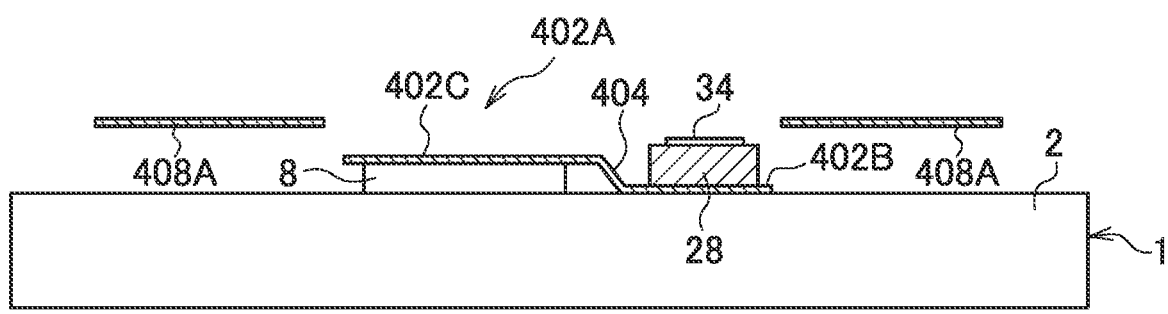

The oscillator 28 is disposed on the first mounting face 402B of the die pad 402A such that the external electrodes 34 of the oscillator 28 are facing upwards, and is fixed to the first mounting face 402B with a bonding agent, as illustrated in FIG. 26C. In cases in which the oscillator 28 is sealed in the package 29 in a state in which the external electrodes 34 face downwards, it is preferable to employ a picker 4 with a rotation mechanism, vertically invert the oscillator 28 using the rotation mechanism after taking out the oscillator 28 using the picker 4, and to place the oscillator 28 on the first mounting face 402B of the die pad 402A after making the external electrodes 34 to face upwards.

Figure 26D:
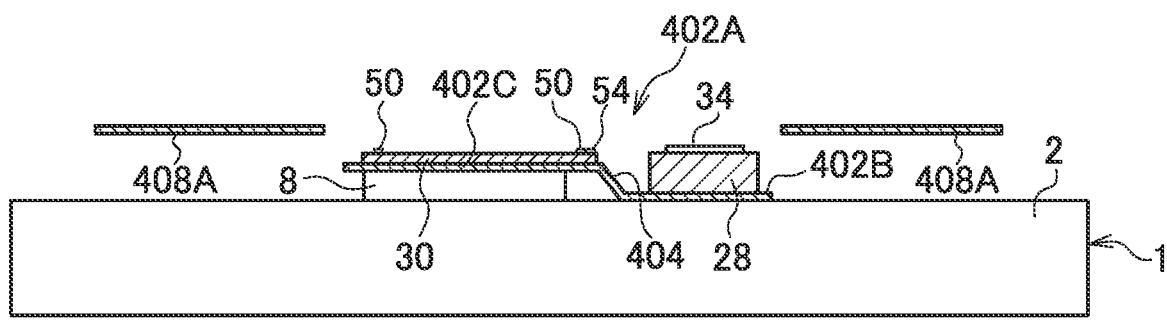

After fixing the oscillator 28 to the first mounting face 402B, the LSI 30 is fixed by a bonding agent to the second mounting face 402C of the die pad 402A, as illustrated in FIG. 26D, such that the electrode pads 50 and the oscillator electrode pads 54 face upwards. Since the second mounting face 402C is formed without overlapping with the first mounting face 402B in plan view, the LSI 30 is also fixed without overlapping with the oscillator 28 in plan view. Further, the LSI 30 and the oscillator 28 are fixed to the faces at the same side of the die pad 402A.

Figure 26E:
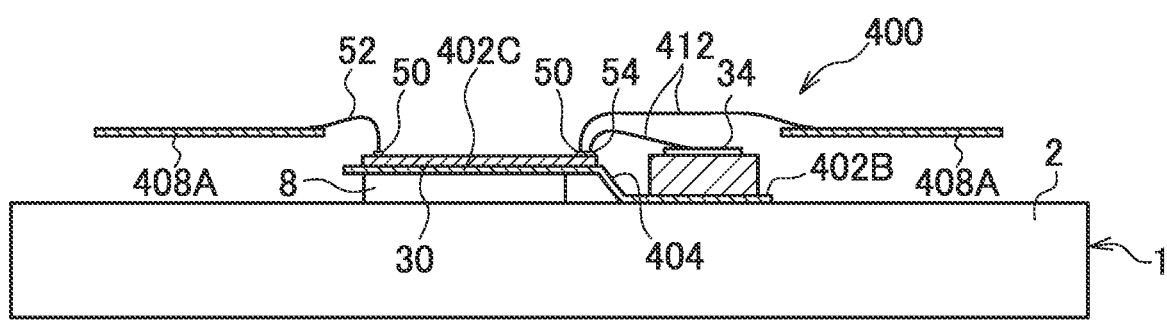

After the LSI 30 has been fixed to the second mounting face 402C, as illustrated in FIG. 26E, the electrode pads 50 of the LSI 30 and the inner leads 408A of the lead frame 402 are connected with the bonding wires 412, and the oscillator electrode pads 54 of the LSI 30 and the external electrodes 34 of the oscillator 28 are connected with the bonding wires 412.

Explanation next follows regarding a procedure of sealing the semiconductor device 400 with a molding resin 32.

Figure 27A:
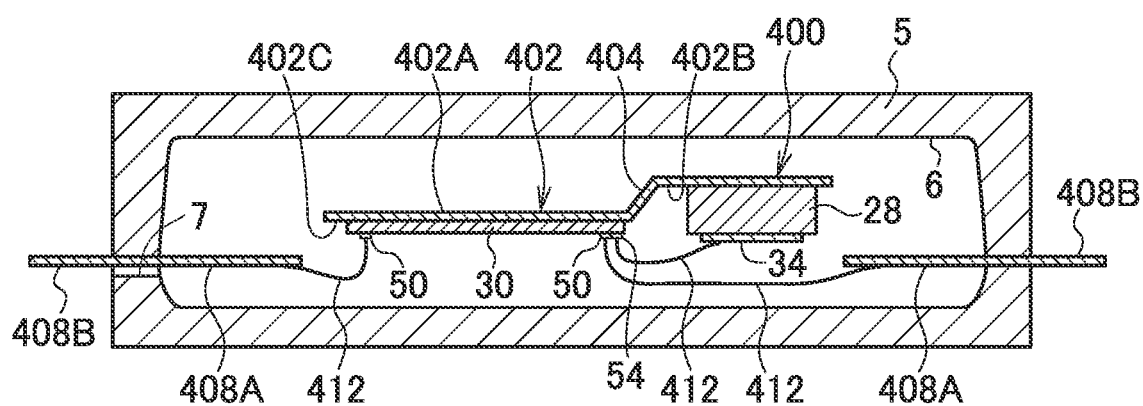
FIG. 27A to 27D are explanatory diagrams illustrating a procedure for resin sealing a lead frame, an oscillator and an LSI in a manufacturing method for manufacturing a semiconductor device according to the fifth exemplary embodiment.

As illustrated in FIG. 27A, in a state in which the semiconductor device 400 has been vertically inverted from the state illustrated in FIG. 26E, the semiconductor device 400 is fixed inside a cavity 6 of a mold 5. At this time, it is preferable to dispose the semiconductor device 400 such that the side of the semiconductor device 400 at which the LSI 30 is mounted is positioned closer to a pouring hole 7 in the mold 5 for pouring the molding resin 32 than the side at which the oscillator 28 is mounted, and a side of the die pad 402A on which the LSI 30 is mounted is positioned in the vicinity of the height direction center of the cavity 6. Further, the semiconductor device 400 is disposed such that outer leads 408B are projected out to the outside of the mold 5.

Figure 27B:
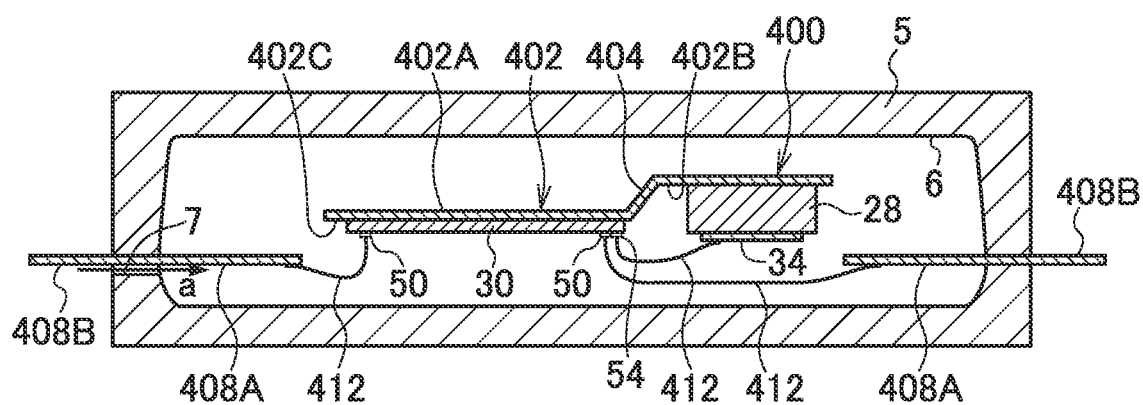

After the semiconductor device 400 has been fixed inside the cavity 6, the molding resin 32 is poured into the cavity 6 through the pouring hole 7, as illustrated by the arrow a in FIG. 27B.

Figure 27C:
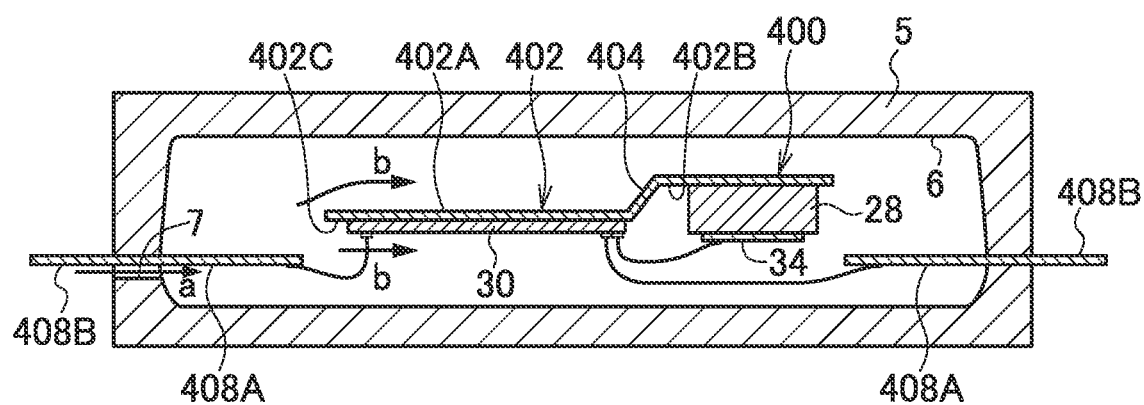

As illustrated in FIG. 27C, the molding resin 32 that has been poured in through the pouring hole 7 flows evenly above and below the lead frame 402 at the portion where the LSI 30 is fixed to the lead frame 402 (the die pad 402A).

However, since the stepped portion 404 is formed to the lead frame 402 (the die pad 402A) in the thickness direction, the portion where the oscillator 28 is fixed to the die pad 402A is bent upwards in FIG. 27A to FIG. 27D with respect to the portion where the LSI 30 is fixed, with the stepped portion 404 defining the boundary therebetween.

Figure 27D:
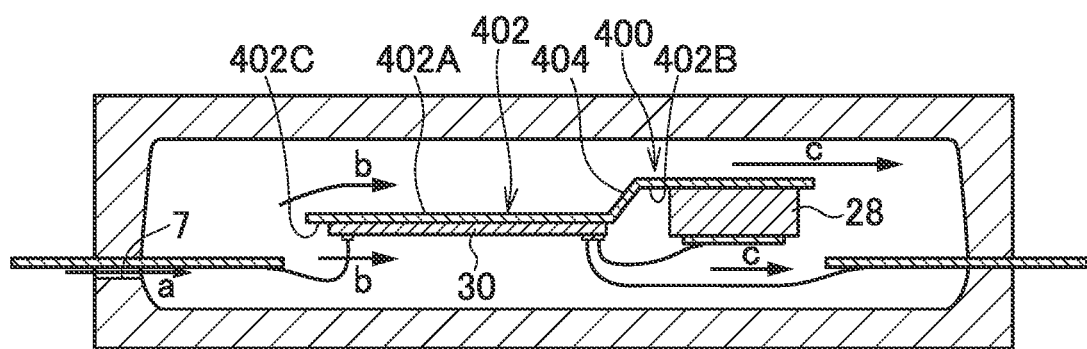

Consequently, as illustrated by the arrows c in FIG. 27D, at the portion where the oscillator 28 is fixed to the die pad 402A, the flow speed of the molding resin 32 below the die pad 402A is slower than the flow speed of the molding resin 32 above the die pad 402A. Hence at the portion of the die pad 402A where the oscillator 28 is fixed, the lower portion in the cavity 6 is preferentially filled with the molding resin 32, the lead frame 402 (the die pad 402A) is supported from below by the poured molding resin 32.

After both sides of the lead frame 402 are filled with the molding resin 32, the mold 5 is heated to cure the molding resin 32.

In the semiconductor device 400 according to the present exemplary embodiment, since the oscillator 28 and the LSI 30 are both mounted on the back face of the lead frame 402, there is no need to invert the lead frame 402 while mounting the oscillator 28 and the LSI 30. Manufacturing efficiency of the semiconductor device 400 can be thereby improved compared to the first exemplary embodiment.

Further, taking the side on which the bonding wires 412 are formed as the lower side, and the second mounting face 402C is positioned lower than the first mounting face 402B. Therefore, the oscillator 28 does not impede the bonding wires 412 while connecting the electrode pads 50 of the LSI 30 and the inner leads 408A by the bonding wires 412 such that the bonding wires 412 straddle across the oscillator 28.

Embodiments are not limited to the configuration in the present exemplary embodiment in which the first mounting face 402B and the second mounting face 402C are provided on the back face of the lead frame 402, and they may be provided on the front face of the lead frame 402. In such cases, a configuration in which the oscillator 28 does not impede the bonding wires 412 can be achieved by taking the side formed with the bonding wires 412 as the lower side, and forming the second mounting face 402C lower than the first mounting face 402B.

Further, embodiments are not limited to the configuration in the present exemplary embodiment in which the second mounting face 402C is formed lower than the first mounting face 402B by the difference in thickness of the LSI 30 and the oscillator 28, as illustrated in FIGS. 27A to 27E. A step may be provided of an amount such that the bonding wires 412 are not impeded, and the lower face of the oscillator 28 may position lower than the lower face of the LSI 30.

Sixth Exemplary Embodiment

Figure 28:
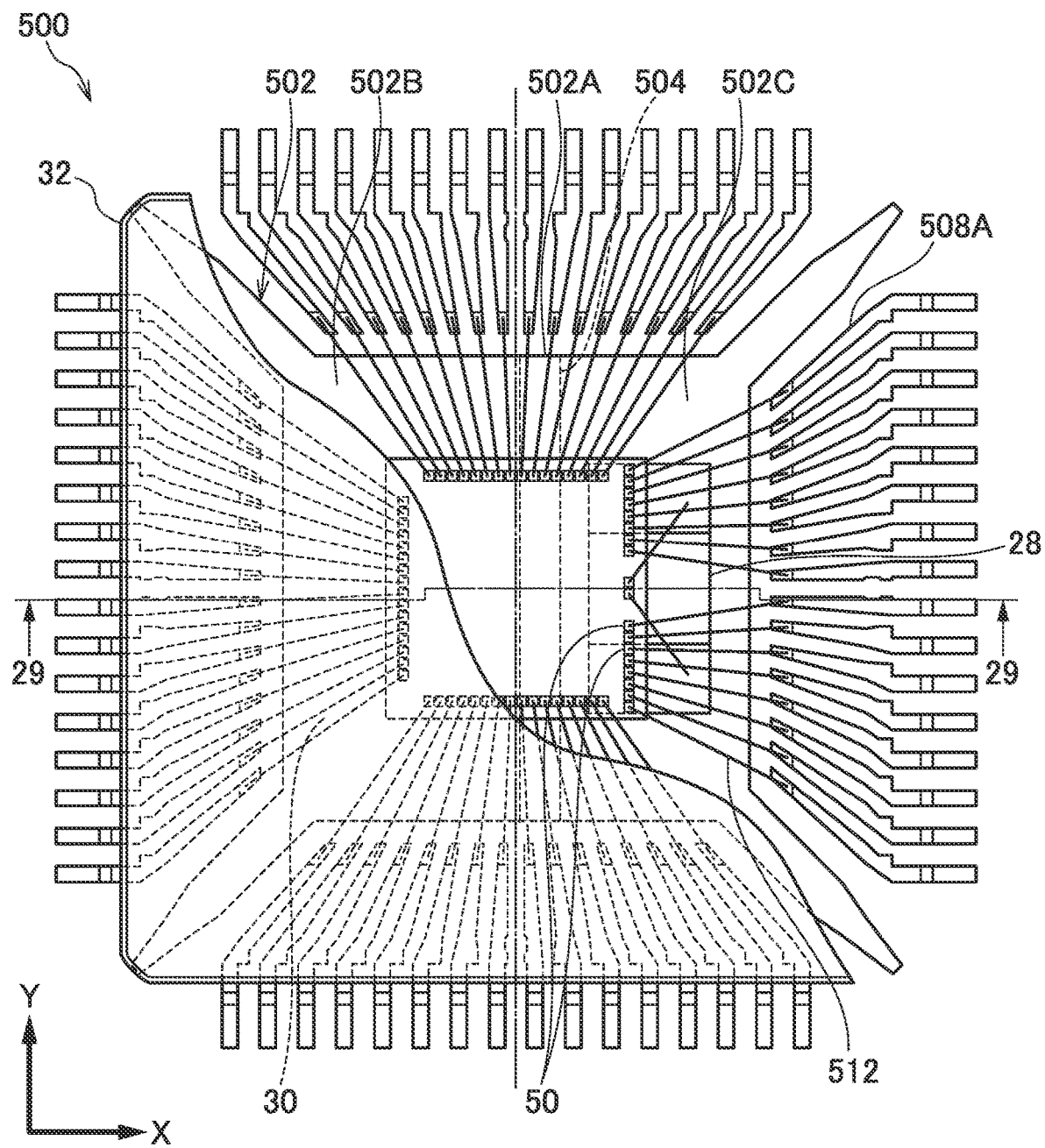
FIG. 28 is a partial cutaway diagram illustrating a semiconductor device according to a sixth exemplary embodiment, as viewed from the back face.
Figure 29:
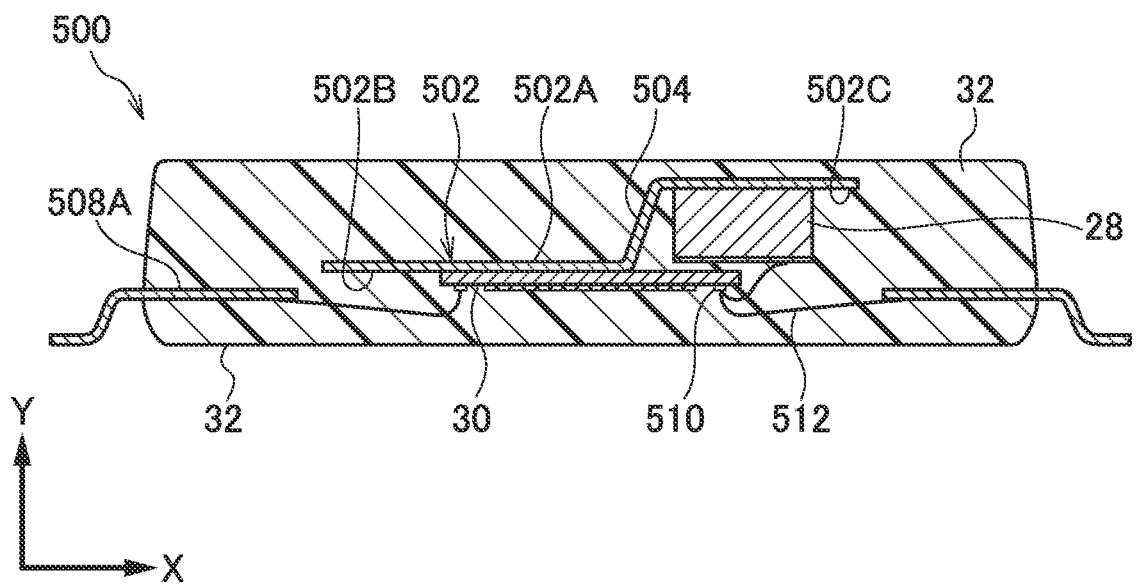
FIG. 29 is a cross-section taken on line 29-29 of FIG. 28.
Figure 30:
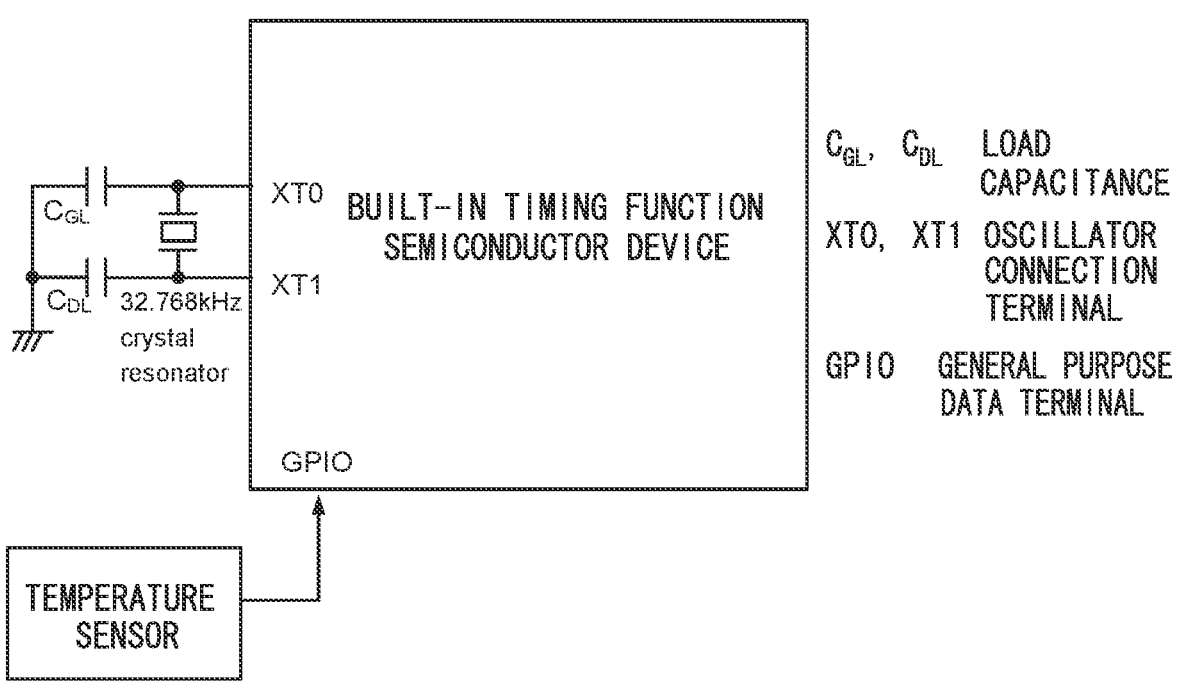
FIG. 30 is a block diagram illustrating a related example of a connection state between a semiconductor device with a built-in timing function and an oscillator.
Figure 31:
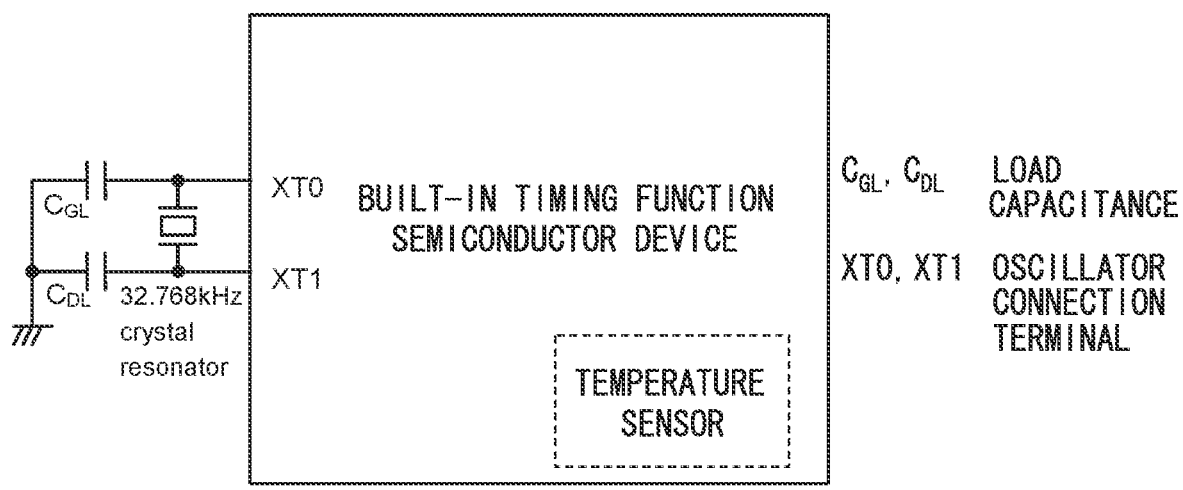
FIG. 31 is a block diagram illustrating another related example of a connected state between a semiconductor device with a built-in timing function and an oscillator.

Explanation follows regarding a semiconductor device 500 according to a sixth exemplary embodiment. Configuration that is similar to that of the first exemplary embodiment is allocated the same reference numerals and explanation is omitted thereof. As illustrated in FIG. 28 and FIG. 29, a stepped portion 504 is formed in a die pad 502A positioned at a center portion of a lead frame 502 according to the present exemplary embodiment, similarly to the fifth exemplary embodiment. As illustrated in FIG. 29, the stepped portion 504 slopes upwards from left to right, and the die pad 502A is divided into a lower positioned first mounting face 502B and an upper positioned second mounting face 502C, bounded by the stepped portion 504.

The first mounting face 502B and the second mounting face 502C are formed contiguously on the back face of the lead frame 502, and are formed parallel to inner leads 508A. An LSI 30 is mounted to the first mounting face 502B through a bonding agent, and an oscillator 28 is mounted to the second mounting face 502C through a bonding agent. As illustrated in FIG. 28, the LSI 30 is positioned at a central portion of the lead frame 502, and a portion at the right end of the LSI 30 covers a portion of the oscillator 28. Namely, the oscillator 28 and the LSI 30 are disposed so as to overlap each other in plan view projection.

A procedure of configuring the semiconductor device 500 including fixing the oscillator 28 to the first mounting face 502B of the die pad 502A, fixing the LSI 30 to the second mounting face 502C, and connecting oscillator electrode pads 54 of the LSI 30 and external electrodes 34 of the oscillator 28, and connecting electrode pads 50 of the LSI 30 and leads 38, using bonding wires 512, is similar to that of the semiconductor device 400 of the fifth exemplary embodiment, as illustrated in FIG. 26A to FIG. 26E. A procedure of sealing the semiconductor device 500 with a molding resin 32 is also similar thereto, as illustrated in FIG. 27A to 27D.

In the semiconductor device 500 according to the present exemplary embodiment, since the LSI 30 is mounted to a central portion of the lead frame 502, the distance between the electrode pads 50 of the LSI 30 and inner leads 508A can be made constant on each of the sides of the LSI 30. Therefore, wire bonding can be performed easily. Other operational aspects are similar to those of the fifth exemplary embodiment.

Although explanation has been given above of the first exemplary embodiment to the sixth exemplary embodiment, the present invention is not limited by these exemplary embodiments. Combinations of the first exemplary embodiment to the sixth exemplary embodiment may be employed, and obviously the present invention may be implemented in various embodiments within a range not departing from the spirit of the present invention. For example, an oscillator including the oscillation circuit 51 may be employed as the oscillator 28. The openings 26C illustrated in FIG. 2 may be configured with slit shaped holes.

What is claimed is:

1. A semiconductor device comprising:
    an oscillator comprising a plurality of external terminals that are disposed on a first face of the oscillator and that are separated from each other by a specific distance along a first direction on the first face;
    an integrated circuit comprising a first region formed with a plurality of first electrode pads and a second region formed with a plurality of second electrode pads along one side on a first face of the integrated circuit, a distance between the first region and the second region in the first direction being narrower than a distance between the plurality of external terminals;
    a lead frame comprising a die pad on which the oscillator and the integrated circuit are mounted and a plurality of leads that are formed along one side on the first face of the integrated circuit and that are electrically connected with the integrated circuit, the oscillator being mounted on the die pad such that the plurality of external terminals are sandwiched between the plurality of first electrode pads and the plurality of leads in a plan view;
    a bonding wire that connects one of the plurality of external terminals to one of the plurality of first electrode pads;
    a first circuit that is connected to the plurality of external terminals of the oscillator via the plurality of first electrode pads; and
    a second circuit that is formed closer to an inner part of the integrated circuit than the first circuit, the first circuit being at least partly disposed in an opening in the second circuit, the second circuit being connected to the plurality of second electrode pads.

2. The semiconductor device of the claim 1, wherein
    the integrated circuit comprises the first circuit which is an oscillation circuit, the oscillation circuit causing the oscillator to oscillate, and
    the second circuit is a digital circuit section that performs processing on a digital signal.

3. A measurement device, comprising:
the semiconductor device of claim 1; and
a measurement section that measures an integration amount according to a signal output from the semiconductor device.

4. A measurement device, comprising:
the semiconductor device of claim 2;
and a measurement section that measures an integration amount according to a signal output from the semiconductor device.

* * * * *